United States Patent
Spencer

(10) Patent No.: US 7,224,219 B2
(45) Date of Patent: May 29, 2007

(54) MODULATOR-AMPLIFIER

(75) Inventor: Michael E Spencer, Escondido, CA (US)

(73) Assignee: American Technology Corporation, San Diego, CA (US)

( * ) Notice: Subject to any disclaimer, the term of this patent is extended or adjusted under 35 U.S.C. 154(b) by 0 days.

(21) Appl. No.: 11/523,363

(22) Filed: Sep. 18, 2006

(65) Prior Publication Data

US 2007/0015473 A1 Jan. 18, 2007

Related U.S. Application Data

(62) Division of application No. 10/501,896, filed as application No. PCT/US03/01854 on Jan. 21, 2003, now Pat. No. 7,109,789.

(60) Provisional application No. 60/350,414, filed on Jan. 18, 2002.

(51) Int. Cl.
*H03F 3/38* (2006.01)
(52) U.S. Cl. ........................... 330/10; 330/251
(58) Field of Classification Search ................ 330/10, 330/251, 207 A; 381/77
See application file for complete search history.

(56) References Cited

U.S. PATENT DOCUMENTS

| | | |
|---|---|---|
| 1,616,639 A | 2/1927 | Sprague |
| 1,951,669 A | 3/1934 | Ramsey |
| 2,461,344 A | 2/1949 | Olson |
| 3,012,222 A | 12/1961 | Hagemann |
| 3,398,810 A | 8/1968 | Clark, III |
| 3,461,421 A | 8/1969 | Stover |
| 3,612,211 A | 10/1971 | Clark, III |
| 3,613,069 A | 10/1971 | Cary, Jr. et al |
| 3,710,332 A | 1/1973 | Tischner et al. |
| 3,742,433 A | 6/1973 | Kay et al. |
| 3,836,951 A | 9/1974 | Geren et al. |
| 4,166,197 A | 8/1979 | Moog et al. |
| 4,295,214 A | 10/1981 | Thompson |
| 4,378,596 A | 3/1983 | Clark |

(Continued)

FOREIGN PATENT DOCUMENTS

EP 0 973 152 1/2000

(Continued)

OTHER PUBLICATIONS

Piwnicki, Konrad, "Modulation Methods Related to Sine-Wave Crossings" IEEE Transactions on Communications, 1983, pp. 503-508, vol. COM-31, No. 4.

(Continued)

*Primary Examiner*—Henry Choe
(74) *Attorney, Agent, or Firm*—Thorpe North & Western LLP

(57) ABSTRACT

A method and device for frequency shifting and amplifying an audio signal for use in a parametric loudspeaker system is disclosed. The method includes the operation of receiving an input audio signal and creating a reference signal. The audio signal is compared with the reference signal to derive a compared product signal. The compared product signal is sent to a switching power stage. Nonlinear preprocessing is performed with respect to the input audio signal, and/or a non-triangle wave is created as the reference signal. The input audio signal is shifted and amplified by modulating the reference signal in the switching power stage.

20 Claims, 34 Drawing Sheets

U.S. PATENT DOCUMENTS

| | | | |
|---|---|---|---|
| 4,418,404 | A | 11/1983 | Gordon et al. |
| 4,600,891 | A | 7/1986 | Taylor, Jr. et al. |
| 4,823,908 | A | 4/1989 | Tanaka et al. |
| 4,991,148 | A | 2/1991 | Gilchrist |
| 5,095,509 | A | 3/1992 | Volk |
| 5,115,672 | A | 5/1992 | McShane et al. |
| 5,317,543 | A | 5/1994 | Grosch |
| 5,357,578 | A | 10/1994 | Taniishi |
| 5,539,705 | A | 7/1996 | Akerman et al. |
| 5,745,582 | A | 4/1998 | Shimpuku et al. |
| 5,758,177 | A | 5/1998 | Gulick et al. |
| 5,809,400 | A * | 9/1998 | Abramsky et al. ......... 455/63.1 |
| 5,859,915 | A | 1/1999 | Norris |
| 5,889,870 | A | 3/1999 | Norris |
| 6,011,855 | A | 1/2000 | Selfridge et al. |
| 6,052,336 | A | 4/2000 | Lowrey, III |
| 6,064,259 | A * | 5/2000 | Takita ......................... 330/10 |
| 6,108,427 | A | 8/2000 | Norris et al. |
| 6,229,899 | B1 | 5/2001 | Norris et al. |
| 6,232,833 | B1 * | 5/2001 | Pullen ......................... 330/10 |
| 6,359,990 | B1 | 3/2002 | Norris |
| 6,378,010 | B1 | 4/2002 | Burks |
| 6,445,804 | B1 | 9/2002 | Hirayanagi |
| 6,768,376 | B2 * | 7/2004 | Begley et al. ................ 330/10 |
| 6,859,096 | B2 * | 2/2005 | Tanaka et al. ................ 330/10 |

FOREIGN PATENT DOCUMENTS

| | | |
|---|---|---|
| JP | H2-265400 | 10/1990 |
| WO | WO 01/08449 | 2/2001 |
| WO | WO 01/52437 | 7/2001 |

OTHER PUBLICATIONS

Marvasti, Farokh, "Modulation Methods Related to Sine Wave Crossings" IEEE Transactions on Communications, 1985, pp. 177-178, vol. COM-33, No. 2.

Pompei; *The Use of Airborne Ultrasonics for Generating Audible Sound Beams*; Presented at the 105th Convention Sep. 26-29, 1998.

Crandall; *The Air-Damped Vibrating System: Theoretical Calibration of the Condenser Transmitter*, pp. 449-460.

Kamakura, et al.; *Suitable Modulation of the Carrier Ultrasound for Parametric Loudspeaker*, Acustica vol. 73 (1991).

Yoneyama, et al.; *The audio spotlight: An application of nonlinear interaction of sound waves to a new type of loudspeaker design*; Acoustical Society of America; May 1983; pp. 1532-1536.

Havelock, et al.; *Directional Loudspeakers Using Sound Beams*; J. Audio Eng. Soc., vol. 48, No. 10, Oct. 2000; pp. 908-916.

Helmholtz; *Excerpts from On DCombination Tones*; pp. 228-238.

Berktay, et al.; *Nearfield effects in end-fire line arrays*; The Journal of the Acoustical Society of America; 1973; pp. 550-556.

Kamakura, et al.; *A Study for the Realization of a Parametric Loudspeaker*; 1985; pp. 1-18.

Makarov, et al.; *Parametric Acoustic Nondicrectional Radiator*; Acustica vol. 77 (1992); pp. 240-241.

Aoki, et al.; *Parametric Loudspeaker—Characteristics of Acoustic Field and Suitable Modulation of Carrier Ultrasound*; Scripta Technica, Inc. 1992; pp. 76-82.

Westervelt; *Parametric Acoustic Array*; The Journal of the Acoustical Society of America; Apr. 1983; pp. 535-537.

Muir, et al.; *Parametric Acoustic Transmitting Arrays*; The Journal of the Acousticval Society of America; 1972; pp. 1481-1485.

Berktay, *Possible Exploitation of Non-Linear Acoustics in Underwater Transmitting Applications*; J. Sound Vib. 1965; pp. 435-461.

Polaroid; *Ultrasonic Ranging System*.

\* cited by examiner

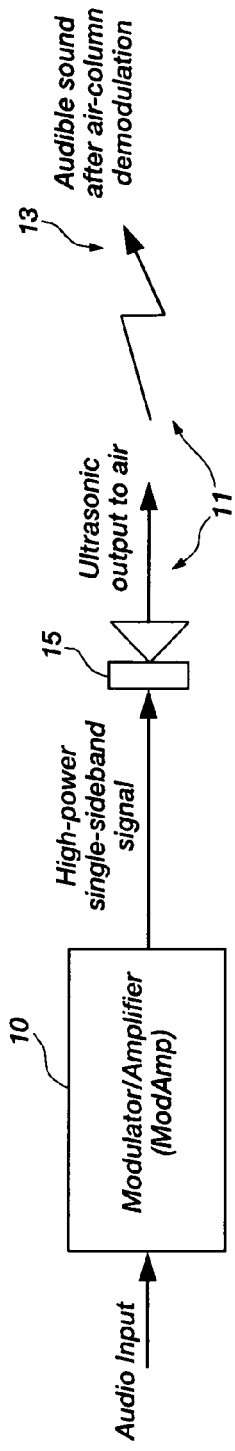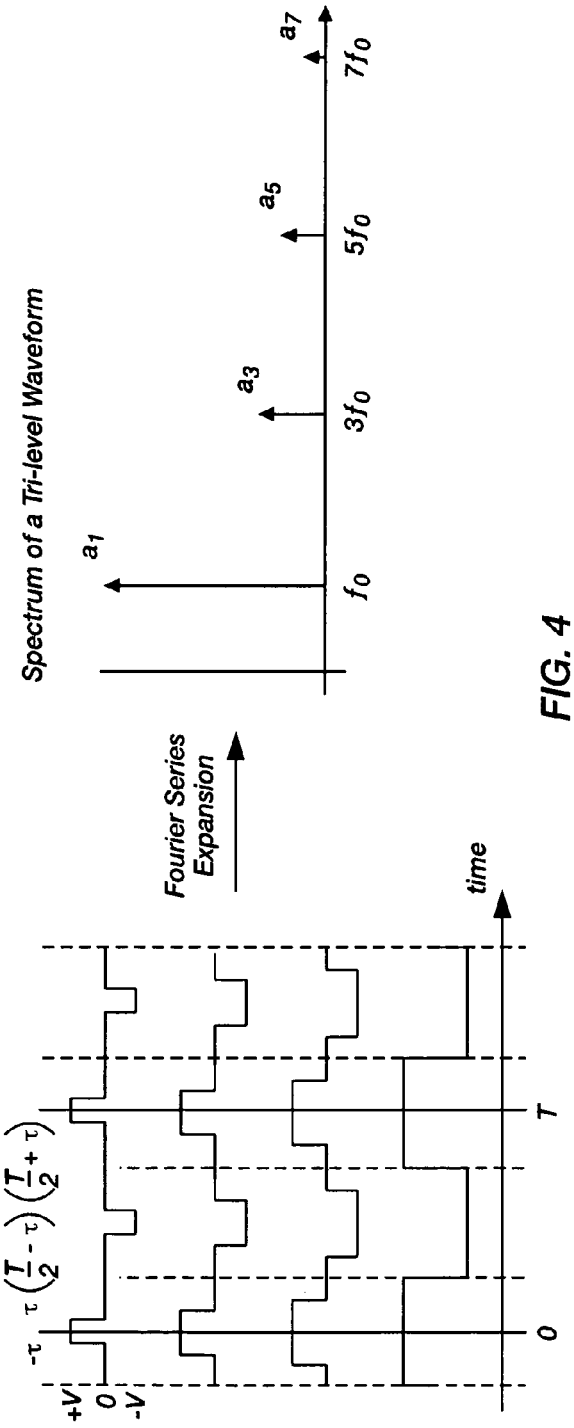

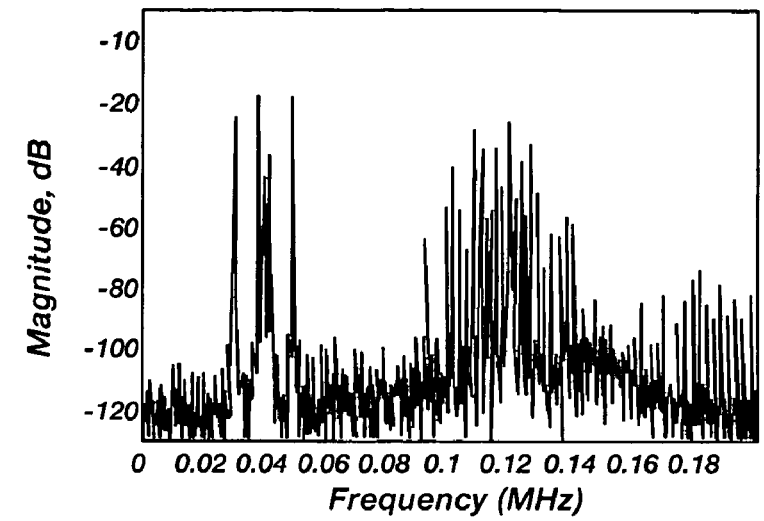
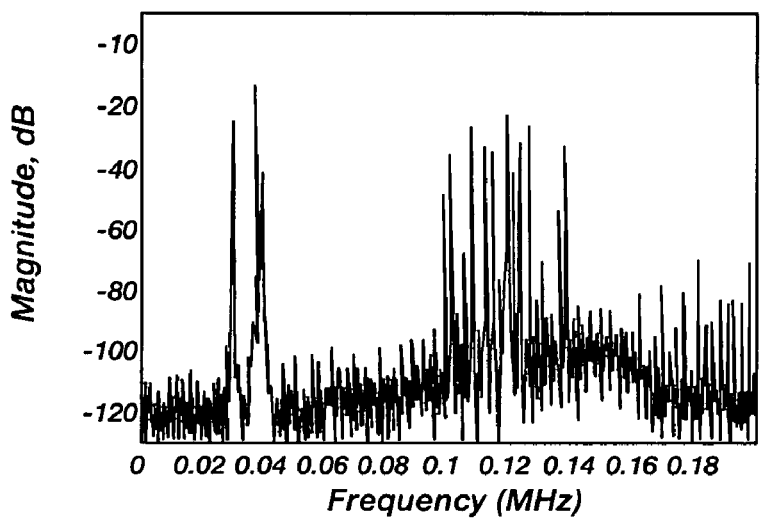
FIG. 8
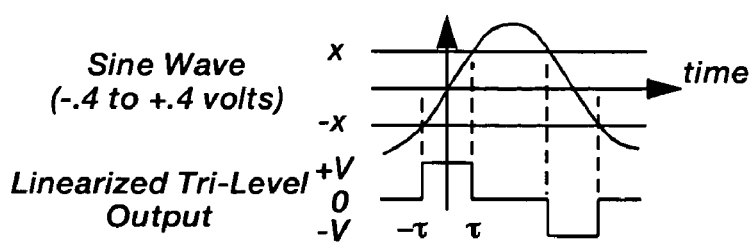
FIG. 9

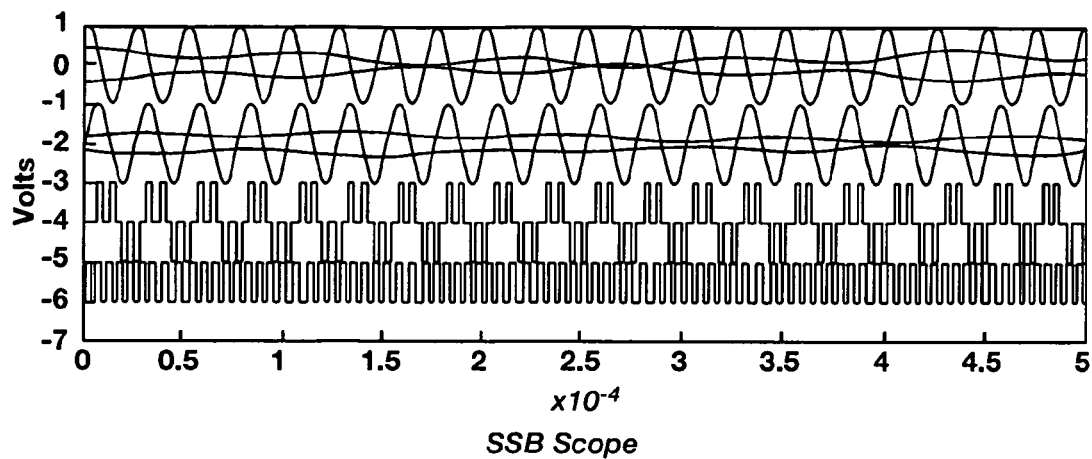
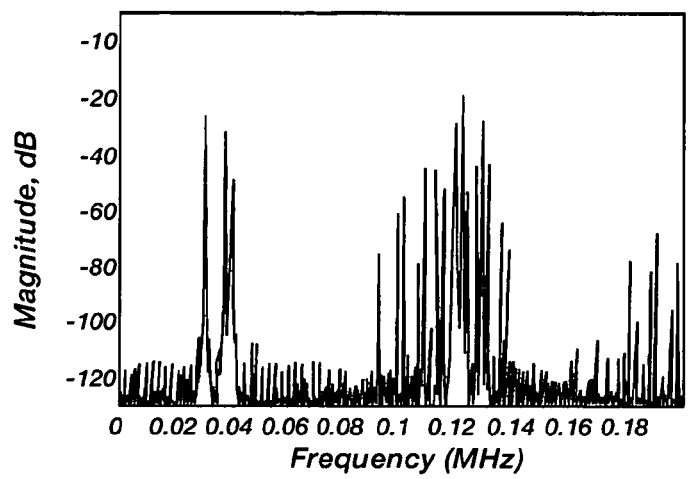
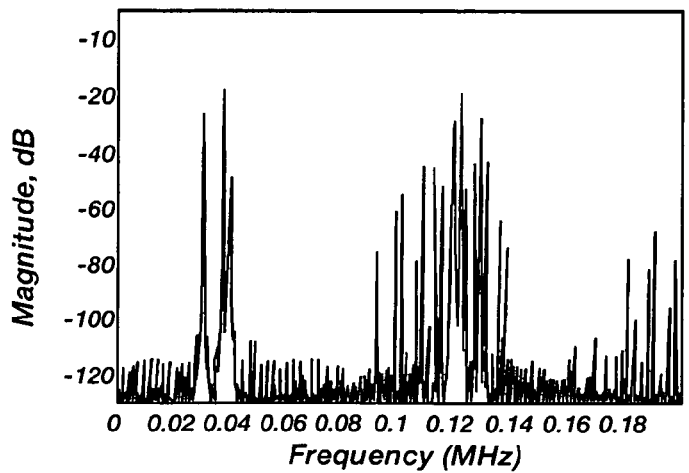
FIG. 20

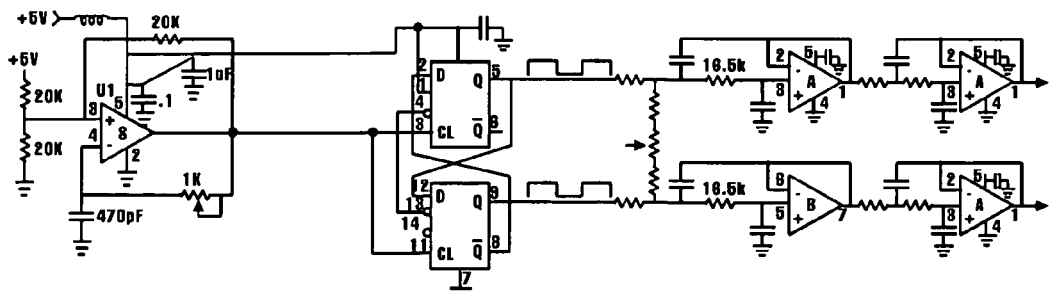
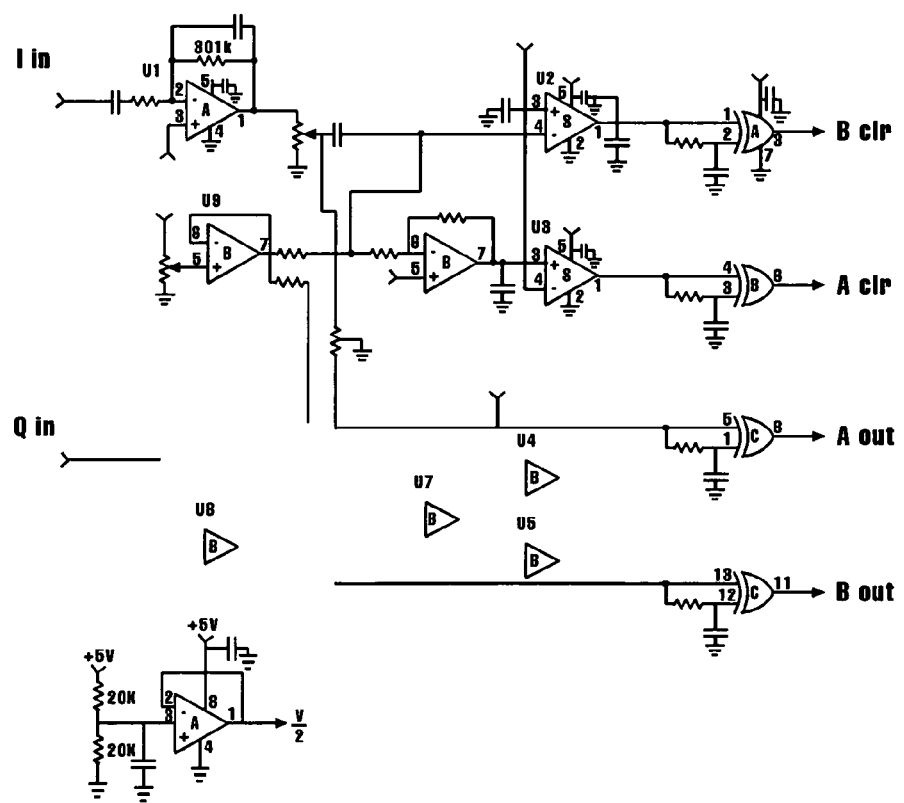
*FIG. 23*

MODULATOR-AMPLIFIER

This application is a divisional of U.S. patent application Ser. No. 10/501,896, filed Jul. 19, 2004, now U.S. Pat. No. 7,109,789, which is a nationalization of PCT/US03/01854, filed Jan. 21, 2003, which claims priority of U.S. Provisional Application Ser. No. 60/350,414 filed Jan. 18, 2002, which is herein incorporated by reference for the relevant teachings consistent herewith.

BACKGROUND OF THE INVENTION

1. Field of the Invention

The present invention relates generally to modulators and amplifiers used in communication and reproduction of audio signals. More particularly, the present invention relates to amplification and modulation equipment where a carrier is modulated in at least one sideband in parametric sound reproduction.

2. Related Art

Modulation of a carrier signal to incorporate audio signal information is well known. Single side band (SSB) and double side band (DSB or AM) modulation including "upper" and "lower" sidebands have been used in radio frequency (RF) communication equipment for many decades to transmit and reproduce audio information. More recently, in the field of parametric audio reproduction, modulation of an ultrasonic carrier signal has been performed. The signal is amplified and fed trough an ultrasonic transducer to produce an audible reproduction of the audio information.

Typically, at least one sideband is used to carry audio signal information. Audio information can be reproduced in a parametric array comprising a fluid medium wherein the transducer is located. The fluid is typically air, but can be other fluids, such as water, for example. The array medium is excited by the transducer at the modulated carrier frequency; and, typically, by non-linear interaction of molecules of the air (or water) medium, audible audio waves are produced. Those audible waves reproduce the audio information in the modulated carrier signal. It will be appreciated that other signal processing can be done, but toward that subject, adherence to the subject matter at hand requires forbearance in setting out more.

Parametric sound reproduction has numerous potential applications. The relatively large power requirements of sound reproduction using this technique is an issue recognized across a range of these applications. Inherently, this technique requires more power than direct excitation of the medium at an audible frequency (audio frequency). For example, conventional audio systems directly generate compression waves reproducing audio information. But in parametric reproduction, the compression waves are created at a higher frequency than that of the audio signal, typically 10 or more times the frequency. Thus changing the excursion direction of the transducer driven element and the coupled medium takes place typically at least this many more times, each change consuming energy. Development of efficient techniques for modulation and amplification of a signal to be sent to the transducer (speaker) as a modulated carrier signal can be of significant benefit in parametric sound reproduction applications. This is because the process of parametric sound reproduction is so inherently power-hungry, improvements in power efficiencies go directly to the bottom line of better reproduction, lower power consumption, and enabling more volume at the distances from the transducer within the array that are of interest in the particular application, especially where that distance is large and/or the desired sound pressure level (SPL) is large at the distance of interest.

Furthermore, the processes of modulation of the carrier, and amplification of the audio source signal, can themselves introduce distortion. For example, audible artifacts of switching in an output stage of a switching amplifier can be problematic. Further, in switching amplification and modulation at frequencies close to the carrier frequency, e.g. about ten times the frequency or less, very noticeable and distracting artifacts are present using conventional techniques. These distortions/artifacts can be noticeable, and distracting, when heard by a listener in a parametric array. They can generally degrade the quality of the audio information heard. Much work has been done in attempting to reduce such undesirable artifacts and distortion. However, due to the necessity for relatively high signal strength, and for increased power in the transducer, these problems remain apparent, and can degrade the listening experience of the hearer in the parametric array.

Improvements in power efficiency and audible signal quality will go far to increase acceptance of parametric sound reproduction technologies. They can be of benefit in other areas where modulation of a reference or carrier signal is used as well. However, it will be understood that for sake of clarity and understanding, the invention will be set forth in the application by means of example. Most of the discussion of the details of implementation will be relevant to parametric sound reproduction using an ultrasonic carrier. But the improvements disclosed herein may well have important applications in other areas.

SUMMARY OF THE INVENTION

A method and device for frequency shifting and amplifying an audio signal for use in a parametric loudspeaker system is disclosed. The method includes the operation of receiving an input audio signal and creating a reference signal. The audio signal is compared with the reference signal to derive a compared product signal. The compared product signal is sent to a switching power stage. Nonlinear preprocessing is performed with respect to the input audio signal, and/or a non-triangle wave is created as the reference signal. The input audio signal is shifted and amplified by modulating the reference signal in the switching power stage.

BRIEF DESCRIPTION OF THE DRAWINGS

FIG. 1 is a functional block diagram in accordance with an embodiment of the invention showing an environment of the invention in a parametric sound reproduction example;

FIG. 4 is a graphical presentation of Tri-level wave forms in one embodiment and a spectrum of the tri-level waveform in a Fourier Series Expansion;

FIG. 8 is a comparison of frequency spectrum displays of AM and SSB outputs from the apparatus shown in FIG. 6.

FIG. 9 is a graphical illustration of how a sine wave can be used to directly synthesize the linearized tri-level pulse waveform and avoid having to place arc sine function hardware in the signal path;

FIG. 20 is a comparison of time and frequency domain plots for an example ModAmp system as shown in FIG. 21 in one embodiment.

FIG. 23 is a schematic diagram of a modulator-amplifier in one embodiment.

DETAILED DESCRIPTION

Figure 2:
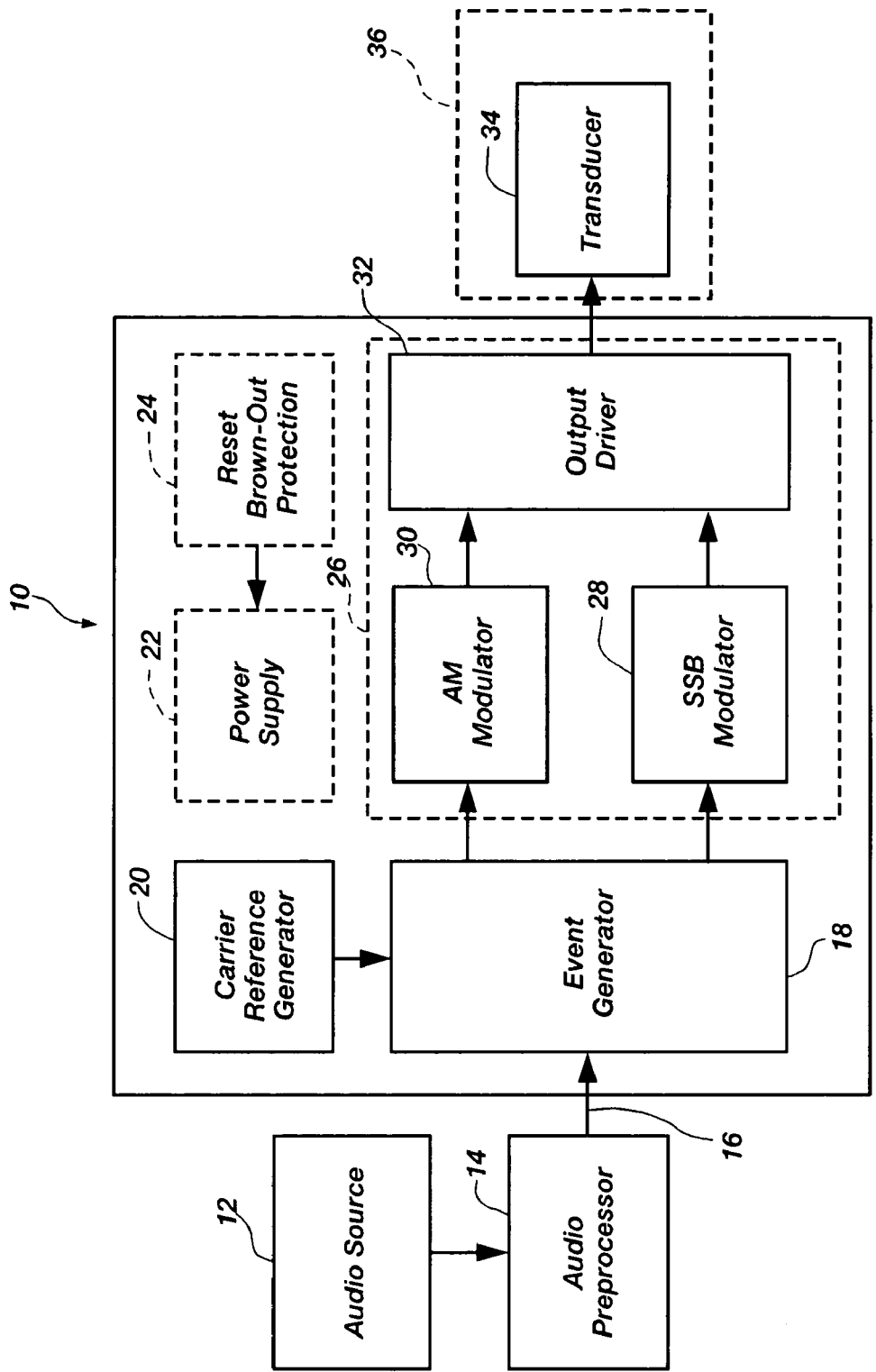
FIG. 2 is an overall functional block diagram of one embodiment of the invention.

Reference will now be made to the exemplary embodiments illustrated in the drawings, and specific language will be used herein to describe the same. It will nevertheless be understood that no limitation of the scope of the invention is thereby intended. Alterations and further modifications of the inventive features illustrated herein, and additional applications of the principles of the inventions as illustrated herein, which would occur to one skilled in the relevant art and having possession of this disclosure, are to be considered within the scope of the invention.

With reference to FIG. 1, illustrating application of the ModAmp 10 in a parametric array 11, a parametric array system generates audible sound 13 in air using a transducer 15 that emits an inaudible ultrasonic frequency signal at sufficient energy. The non-linear acoustic properties of the air perform demodulation of the ultrasonic signal to generate the audible sound. In a typical parametric array system, an ultrasonic carrier signal is modulated by audio source, and then it is amplified and applied to a high-intensity speaker, emitter or transducer. The intense ultrasound causes the air in front of the emitter to exhibit a non-linear transfer characteristic. The air medium's non-linearity generates inter-modulation distortion products, in the form of sum arid difference frequencies. The audible sound is produced by the difference frequencies. For example, an upper sideband modulator with a 1 kHz input and a 40 kHz carrier frequency will produce a 40 kHz and a 41 kHz signal at the speaker 15. The non-linear air column demodulation will produce an audible 1 kHz tone in the array 11.

Parametric arrays 11 give the ability to direct or focus sound into tight beams using physically small transducers 15. The parametric array concept works both in fluids including gases such as air or in liquids such as water. The ModAmp is an ideal solution for the modulation and amplification functions required in parametric array systems because of its small size and high efficiency.

Other applications include AM and SSB transmitters, SONAR signal modulation and amplification, medical ultrasound applications, frequency translating amplifiers, band pass amplifiers, quadrature phase shift keying and quadrature amplitude modulation in various applications.

As illustrated in FIG. 2, a modulator-amplifier system, indicated generally at 10, in accordance with the present invention, takes an audio signal from an audio source 12, which can be pre-processed in one or more ways, for example pre-distorted to correct for certain distortions inherent in parametric sound reproduction, in an audio signal preprocessor 14. The audio signal input 16 is coupled to an event generator 18. The input signal can be expressed in an in-phase (I) and quadrature (Q) sinusoidal signal. As will be appreciated the quadrature signal is a cosine (90 degrees out-of-phase) signal, based on the I signal. The input signal is compared to a carrier signal created by a reference signal generator 20 by the event generator.

It will be appreciated that a power supply 22 is provided to provide power in accordance with voltage and current parameters required by the various elements, as will be discussed below in further detail. A brown-out protection circuit 24 can be provided, as will be discussed in further detail below, where the reference signal frequency is based on a wall socket high voltage source of AC power at some frequency.

As will be further described below, timing signals or pulses are created by the event generator 18, and these and the reference signal generated by the carrier reference signal generator 20 are fed into a modulator/amplifier switching output driver stage 26. There the carrier signal is modulated according to the pulses generated by the event generator. This can be done so that the carrier is SSB modulated, by an SSB modulator portion 28 or DSB modulated, by an AM modulator portion 30. This is by state switching in an output driver 32, which all will be more fully discussed below in connection with example embodiments. The carrier signal can also be asymmetrically modulated, that is by modulating on the upper and lower sidebands by different amounts.

The carrier is switch-modulated at some multiple of the carrier frequency, e.g. 2, 3, 4, 5, 6 or more times the carrier frequency; and the modulated carrier signal is fed to a transducer 34 for reproduction of the information in the audio signal from the audio source 12 in a parametric array 36 in a medium. There is a non-linear relationship between events in the audio signal from the audio source, and the occurrence of state changes in the switching in the output driver 32. This can be in accordance with an arcsine function in one embodiment. It develops that when this relationship is used certain problems are elegantly solved, and distortion is minimized and a lower multiple of carrier frequency can be used in output switching. Also, in the output stage, 2 state, 3-, 5- etc. state switching can be used, for different example implementations which will be discussed.

The non-linear relationship of the audio input signal and the state change timing in the switching output driver 32 is a feature not found in conventional class-D amplifiers. The advantages obtained are not unique to the application of parametric sound reproduction in the parametric array 36, but its use is unique to date in the parametric art at the time of application for letters patent.

Figure 3:
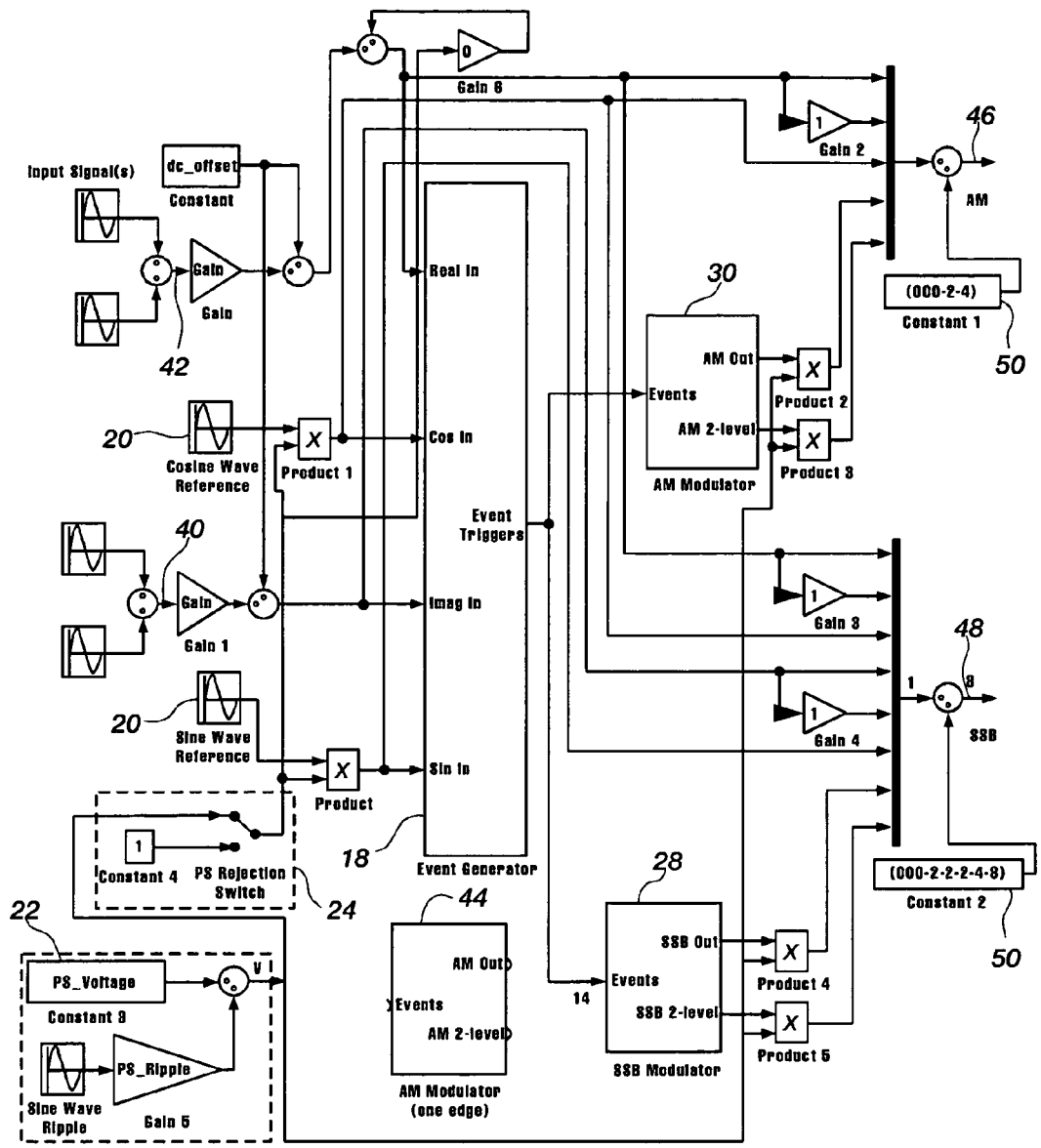
FIG. 3 is a combination top-level functional block diagram and schematic diagram giving additional detail regarding the embodiment shown in FIG. 2

With reference now to FIG. 3, the modulator-amplifier 10 can be illustrated schematically in one embodiment, wherein the system block diagrams are presented for generalized ModAmp Bi-Level SSB and DSB modulator/amplifier. In the illustrated example, inputs are sinusoidal waveforms including audio information of interest. Typically pre-recorded program material is used, but live feed audio can also be the information of interest. The input signal includes in-phase 40 and quadrature signals, as discussed further below, which are compared to reference signals and fed to the event generator 18. Pulse signals are generated based on a non-linear functional relationship between the input signals and the reference signals. The pulse signals, or event triggers are fed to one or more of the double sideband (AM) modulator or SSB modulator, or to another kind of modulator. For example a one-edge AM modulator 44, as discussed below, can be used in another embodiment. 3 and 2 level outputs from the modulators are provided in the illustrated embodiments. Switching between steady states in the output stage is based upon the event triggers comprising pulse signals from the event generator. As mentioned, comparators are provided to compare input signals to reference signals and generate the pulses used to initiate the state changes. Depending on whether the switch-mode is bi-level or tri level a reference signal from the reference signal generator 20 powered by the power supply 22 is modulated low-high or low-zero-high to produce a modulated carrier signal at an ultrasonic frequency at an AM output 46 or SSB output 48. A constant 50 can be added to the amplitude to better match an ultrasonic transducer in a parametric array (not shown).

Using this scheme, an input signal 16 can be used to modulate a carrier with a variety of schemes such as amplitude modulation (AM) or single sideband modulation (SSB). The modulator generates an output with a small number of discrete output amplitudes (or voltage levels). Typically 2 or 3 discrete output levels are used, however as many as 8 levels can be implemented. The modulator output can be amplified to any arbitrary level by increasing the voltage swing. In its simplest form, the modulator output is a binary signal that is either low or high. This binary signal can be applied to MOSFET switches to increase the voltage swing thereby increasing or amplifying the signal. By using this switching technique, high-efficiency power modulator/amplifiers may be realized. The combined modulator/amplifier is referred to as a ModAmp in this disclosure. The ModAmp output spectrum consists of the desired modulated signal plus high frequency switching products. In typical applications, a lowpass filter is used to remove the high frequency switching products. It is not necessary to have a carrier tone present in the modulator output. The AM or SSB signal may have a carrier present or may be operated in a suppressed carrier fashion. When the carrier is suppressed, the SSB ModAmp performs frequency translation and amplification. That is, the input signal is frequency shifted and amplified by the ModAmp.

With reference to FIG. 4, bidirectional pulse waveforms with progressively wider pulse widths give progressively stronger fundamental to amplitudes, $a_1$ as given by equation (7) set forth below. The spectrum of a tri-level waveform consists of the fundamental and odd harmonics. By varying the positive and negative pulse widths of the tri-level signal as shown in the Figure, we can change the intensity of the fundamental tone, $a_1$. Pulse width modulation of this tri-level waveform is an effective way to perform AM modulation at the carrier frequency. But first, we must understand how the fundamental tone amplitude varies with pulse width. The amplitude of the fundamental and harmonic tones are derived below in the following examples. It is shown that the tri-level waveforms generate the fundamental and only odd harmonics. This puts the first out-of-band component at three times the carrier frequency. Note that the waveform described is a tri-level waveform, however, a bi-level (binary) waveform may also be used. This is detailed in a later discussion below. These modulation techniques are easily extended to multi-level signals (e.g. 4-level, 5-level, etc.) as will be appreciated by those skilled in the art.

The fundamental amplitude of the output signal is a non-linear function of the pulse width parameter. Recall that a real periodic signal with period $T=1/f_o$ can be written in terms of it's Fourier Series expansion:

$$f(t) = \frac{a_0}{2} + \sum_{n=1}^{\infty} (a_n \cos n\omega_0 t + b_n \sin n\omega_0 t) \quad (1)$$

where $$a_n = \frac{2}{t} \int_{t_1}^{(t_1+T)} f(t) \cos n\omega_0 t \, dt \quad (2)$$

and

-continued $$b_n = \frac{2}{t}\int_{t_1}^{(t_1+T)} f(t)\sin n\omega_0 t \, dt \quad (3)$$

with $$\omega_0 = 2\pi f_0 = \frac{2\pi}{T} \quad (4)$$

The Fourier coefficients, $a_n$, and $b_n$, represent the amplitudes of the cosine and sine signals, respectively, that make up the spectrum of the periodic signal f(t). For the bi-directional pulse waveforms in FIG. 4, and using (2) and (3), it can be shown that the amplitudes of the fundamental and harmonic tones are given by and $$b_n = 0, \text{ for all } n \quad (6)$$

$$a_n = \begin{cases} V\frac{4}{\pi n}\sin(2\pi n f_0 \tau), & \text{for } n = 1, 3, 5, \ldots \text{ odd integers} \\ 0, & \text{otherwise} \end{cases} \quad (5)$$

where V is the peak value of the output waveform (or the power supply voltage) as labeled in FIG. 4.

Of particular interest is how the amplitude of the fundamental, $a_1$, varies with the pulse-width control parameter $\tau$. From (5), it can be seen that the fundamental tone amplitude is given by the following non-linear function of $\tau$:

$$a_1 = V\frac{4}{\pi}\sin\left(\frac{2\pi\tau}{T}\right) \quad (7)$$

The fundamental amplitude has a maximum peak value of $V(4/\pi)=V\times 1.273$ when $\tau=T/4$. This corresponds to a square wave output signal. Note that the peak output level at the carrier frequency can be greater than the power supply rail, V.

Figure 5:
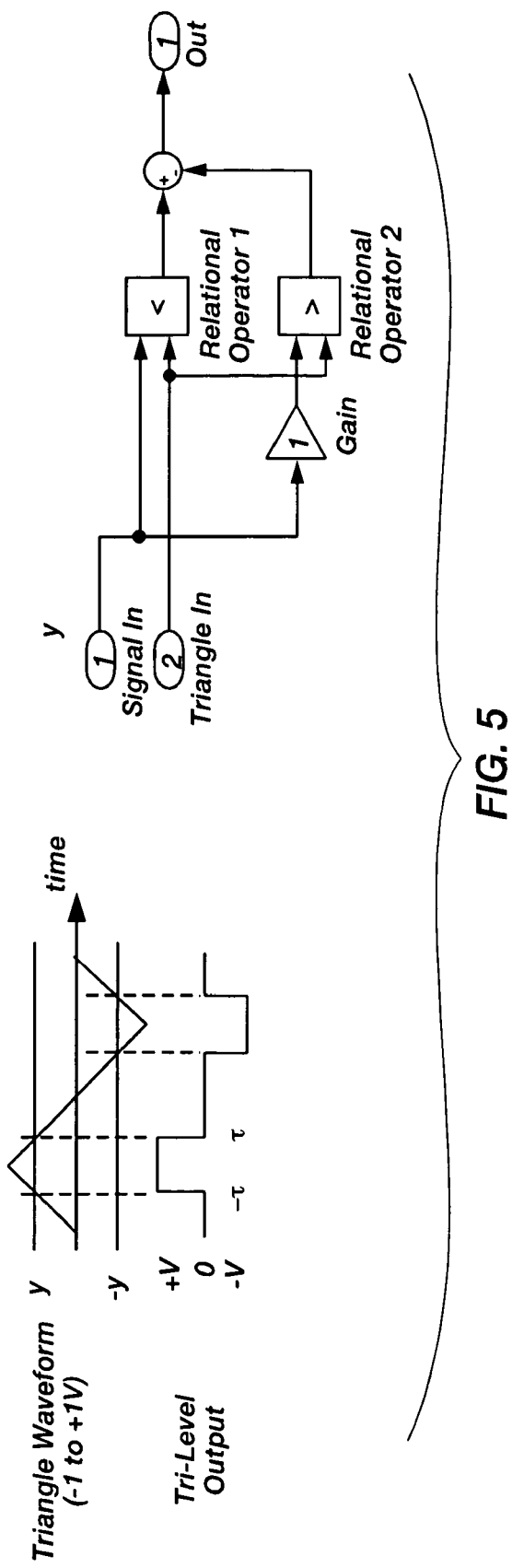
FIG. 5 is a comparison of a tri-level pulse generator shown in functional block diagram format with example waveforms.

A triangle wave and two comparators can be used to generate the tri-level waveform, as shown in FIG. 5. A triangle wave can be used to synthesize the tri-level pulse waveform. The output of the Tri-Level Pulse Generator can be directly filtered to produce a low level modulator output, or it can be amplified to deliver a high-power modulator output. From the figure, notice that as the comparator threshold variable y varies from 0 to 1, $\tau$ will vary from T/4 to 0, or $$\tau = \frac{T}{4}(1-y) \quad (8)$$

Suppose we want to perform linear AM modulation, that is, we want the output's fundamental tone amplitude to vary linearly (between 0 and it's maximum of $4/\pi$) with some input variable or signal, x. Specifically, let the amplitude of the fundamental be $$a_1 = K\frac{4}{\pi}x \quad (9)$$

where K is a constant (typically K=V). If K=V then the fundamental amplitude will vary between 0 and it's maximum of $V(4/\pi)$ as x varies from 0 to 1. By combining (7), (8), and (9) it is easy to show that the comparator threshold variable y in FIG. 5 can be written as $$\boxed{y = 1 - \frac{2}{\pi}a\sin\left(\left(\frac{K}{V}\right)x\right)} \quad (10)$$

Equation (10) is a necessary condition to achieve a linear variation of fundamental amplitude with the control variable, x. This equation applies when using the linear pulse width modulator of FIG. 5. Equation (10) is a necessary (but not sufficient) condition for low distortion AM and SSB modulation. Note that the spectrum given by the Fourier series expansion is only valid for a periodic signal, hence, it has been assumed the pulse width, (and 'T') has remained constant with time. Moreover, feeding the audio signal into a comparator with a triangle wave (a naturally sampled bi-pulse width generator) will cause significant distortion of the output spectra due to the non-linear relationship of pulse-width to fundamental tone amplitude. Therefore, we must linearize the system with the arcsine function. Distortion will result if we don't perform the arcsine function with this modulator example.

Figure 6:
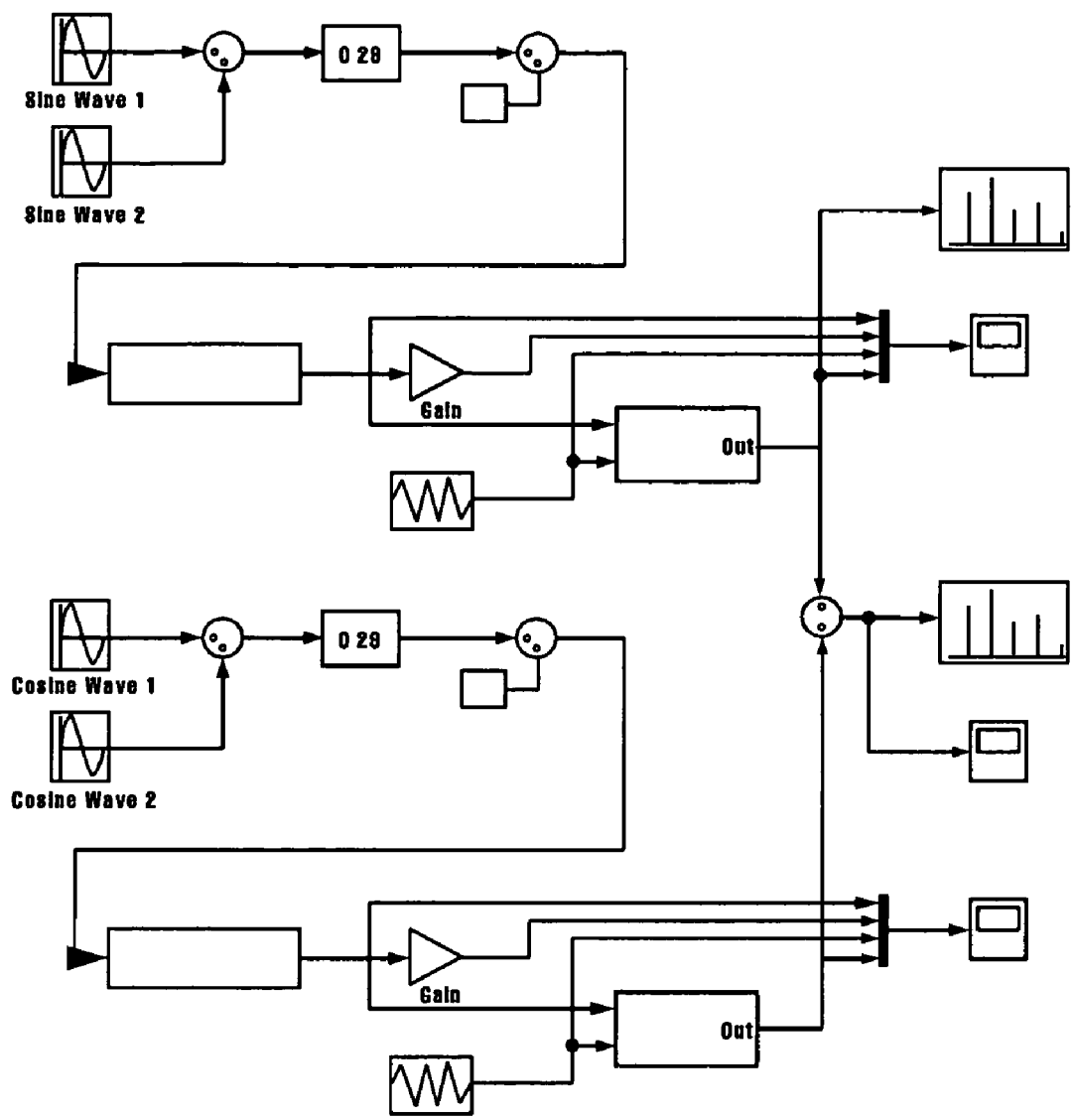
FIG. 6 is a functional block diagram illustrating a test set-up in one embodiment.

Next, rather than holding the control variable, x, at a constant, we let it change with an input signal. This achieves AM modulation of the input signal at the carrier frequency of $f_o$. FIG. 6 illustrates by a block diagram the AM and SSB modulators that use an arcsine linearizer and triangle wave comparator. The input consists of a sum of two sinusoids, one at 2,100 Hz and the other at 9,300 Hz. Next, a DC bias/offset is added to the signal, and it is passed into the AM linearizer comprising an arcsine function. A 40 kHz triangle wave is used with the tri-level pulse generator to generate the AM output.

To achieve SSB modulation, a similar signal processing path is used in the lower part of the block diagram, with the difference being the input signal is presented in quadrature and the triangle waveform is shifted by 90 degrees. For a generalized input signal a Hilbert transform can be used to generate the required analytic signal (consisting of in-phase and quadrature components). A lower sideband output is derived by subtracting the 2 AM outputs. Upper sideband would result if we added the two AM outputs.

Figure 7:
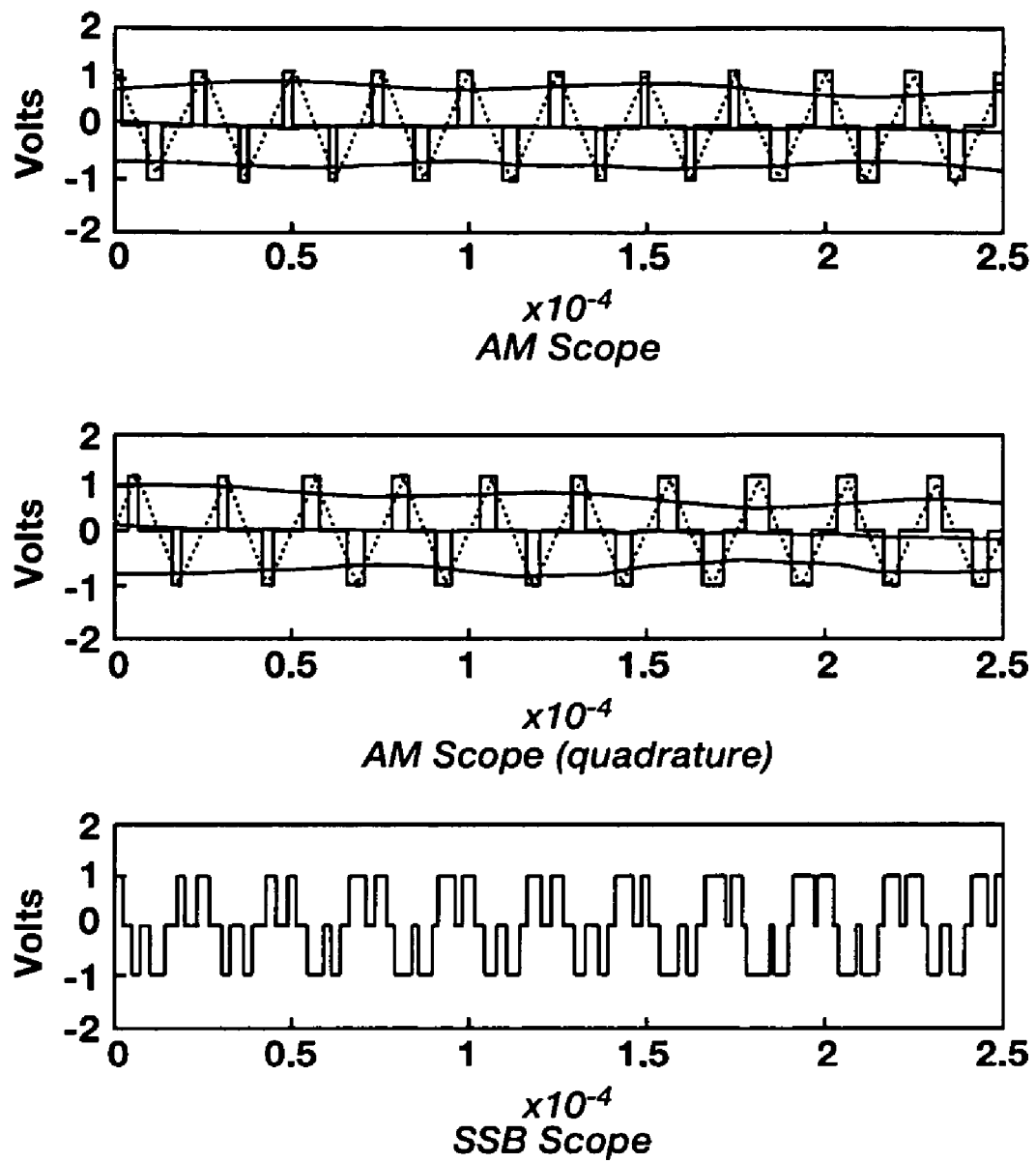
FIG. 7 is a comparison of waveforms generated by the set-up shown in FIG. 6.

The waveforms for the AM and SSB modulators are shown in FIG. 7 in time domain waveforms of a simulation output. In general, the SSB waveform can take on 5 different amplitude levels since it is the sum of two tri-level waveforms. However, if the modulator's offset constants are set appropriately and the input signal levels are limited to a certain value, then the SSB output will only take on only three levels.

The spectrum of the AM and SSB outputs are shown in FIG. 8. In the AM case the carrier and 40 kHz and the upper and lower side tones are clearly seen on the left portion of the spectrum. Switching products centered at three times the carrier frequency (120 KHz) are also visible. The switching products may be filtered out by a lowpass filter (not shown). The spectrum displays are generated in the simulation by passing the analog signal through 150 kHz, 8th-order Elliptic lowpass filter, sampling the analog signal at 400 kHz and taking a 8,192 point Fast Fourier Transform (FFT) with a Hanning window. Higher frequency switching products are also present but are not shown above 200 KHz. The spectrum display is only accurate out to 150 KHz because this is where the lowpass filter begins to rolloff. The filter prevents aliasing in the FFT.

To realize the power amplifier portion of the ModAmp, the switching output waveforms are increased to the desired amplitude and passed through a lowpass filter to attenuate the high frequency switching components. A power amplifier based tri-level SSB modulation can employ an H-bridge and appropriately switching the two halves of the bridge to achieve the tri-level outputs. An example ModAmp that uses this technique is detailed below.

Note that the DC bias sets the nominal carrier level. In an alternative realization as set forth below, we can operate with the carrier suppressed.

We now take up the subject of a Sine Wave Comparator, whereas above we computed the arcsine of the input signal, x, so we could achieve linear operation when using a comparator with a triangle wave input (the linear bi-pulse width generator shown in FIG. 5). However, instead of a triangle wave, we can implicitly compute the arcsine by using a sine wave signal with a different comparator configuration. This eliminates the need for the arcsine function in the signal path. A linearized tri-level output signal can be directly synthesized by using a sine wave reference oscillator as shown in FIG. 9. In this case, a pulse is generated during the time that the absolute value of the sine wave is less than the input, x. The point at which the sine wave intersects the input value, x defines the time instant $t=\tau$, and the following equation can be deduced from the figure, $$x = A\sin\left(\frac{2\pi}{T}\tau\right) \quad (11)$$

where A is the amplitude of the sine wave reference signal.

Solving this equation for $\tau$ and substituting it into the equation for the fundamental tone amplitude, (7); gives us a linear relationship between the input, x and the output tone amplitude:

$$a_1 = \left(\frac{V}{A}\right)\frac{4}{\pi}x \quad (12)$$

If A is set to V/K then this equation is identical to (9). The important point here is that the fundamental amplitude is a linear function of the input or control variable, x.

Figure 10:
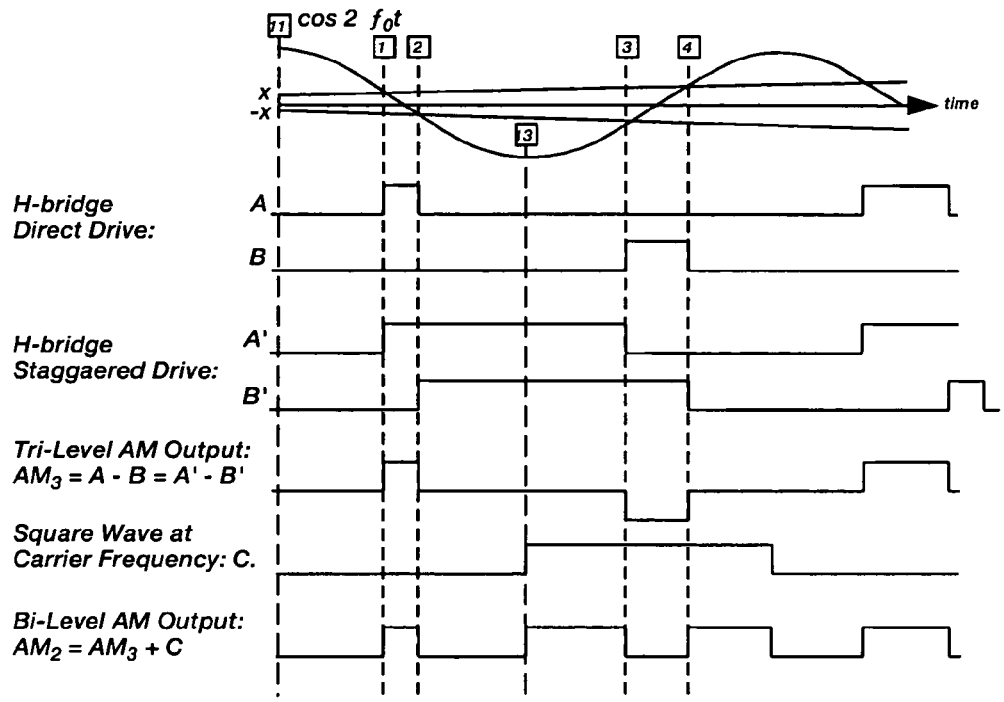
FIG. 10 is a graphical illustration of various waveforms showing sine wave synthesis of tri-level and bi-level AM in one embodiment of the invention.

With reference now to FIG. 10, Tri-Level AM and SSB with an H-bridge will now be discussed. In one embodiment we can implement tri-level AM by using an H-bridge and appropriately driving the two half bridges. FIG. 10 shows the various waveforms that may be used to generate the AM modulator output. The two halves of the H-bridge can be driven by the A and B "direct drive" signals to achieve the tri-level AM output. Alternatively, a "staggered drive" may be used as shown in the A' and B' signals. All the output waveforms can be generated by triggering state transitions on the timing events as labeled in FIG. 10. For tri-level output, the DC bias must be appropriately set and input signal amplitude must be limited. If the load is placed in the center of the H-bridge, the differential gives us the desired tri-level AM output signal. The numbered boxes label the timing events that trigger the waveform transitions. The bi-level output is derived by adding a square wave at the carrier frequency.

Figure 11:
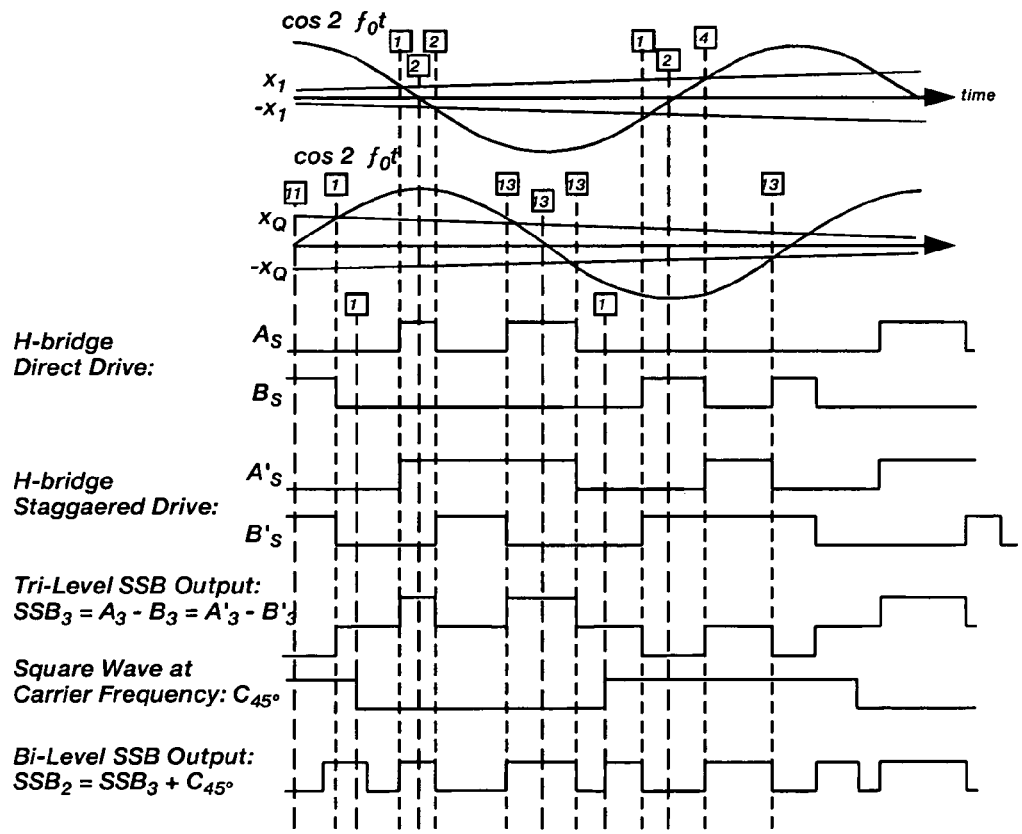
FIG. 11 is a graphical illustration of various waveforms showing sine wave synthesis of tri-level and bi-level SSB modulation in one embodiment of the invention.

Turning now to FIG. 11, the signals for single sideband (SSB) synthesis are illustrated. In this case, sine and cosine waves are compared to the input signals consisting of in-phase $X_I$ and quadrature $X_Q$ components (90 degrees out of phase from one another). The in-phase and quadrature components are typically derived by using a Hilbert transformer. Fourteen events are defined in the figure at zero crossings of the sine waves or crossings of the input signals with the sine waves. Two alternative sets of H-bridge drive signals are shown: $A_S$, $B_S$ and $A'_S$, $B'_S$. If the load is placed in the center of the H-bridge, the differential gives the desired Tri-Level SSB Output signal. Again, the numbered boxes label the timing events that trigger the waveform transitions. B bi-level output is derived by adding a square wave at the carrier frequency.

Turning again to the top-level block diagram of the modulator/amplifier of FIG. 3, in one embodiment sinusoidal input test signals are generated in quadrature and drive the real and imaginary inputs of the Event Generator block 18. The event generator derives a series of 14 short pulses, or event triggers, that are used by the AM and SSB modulators 30, 28 respectively. The event generator, AM, and SSB modulators are detailed below.

Figure 12:
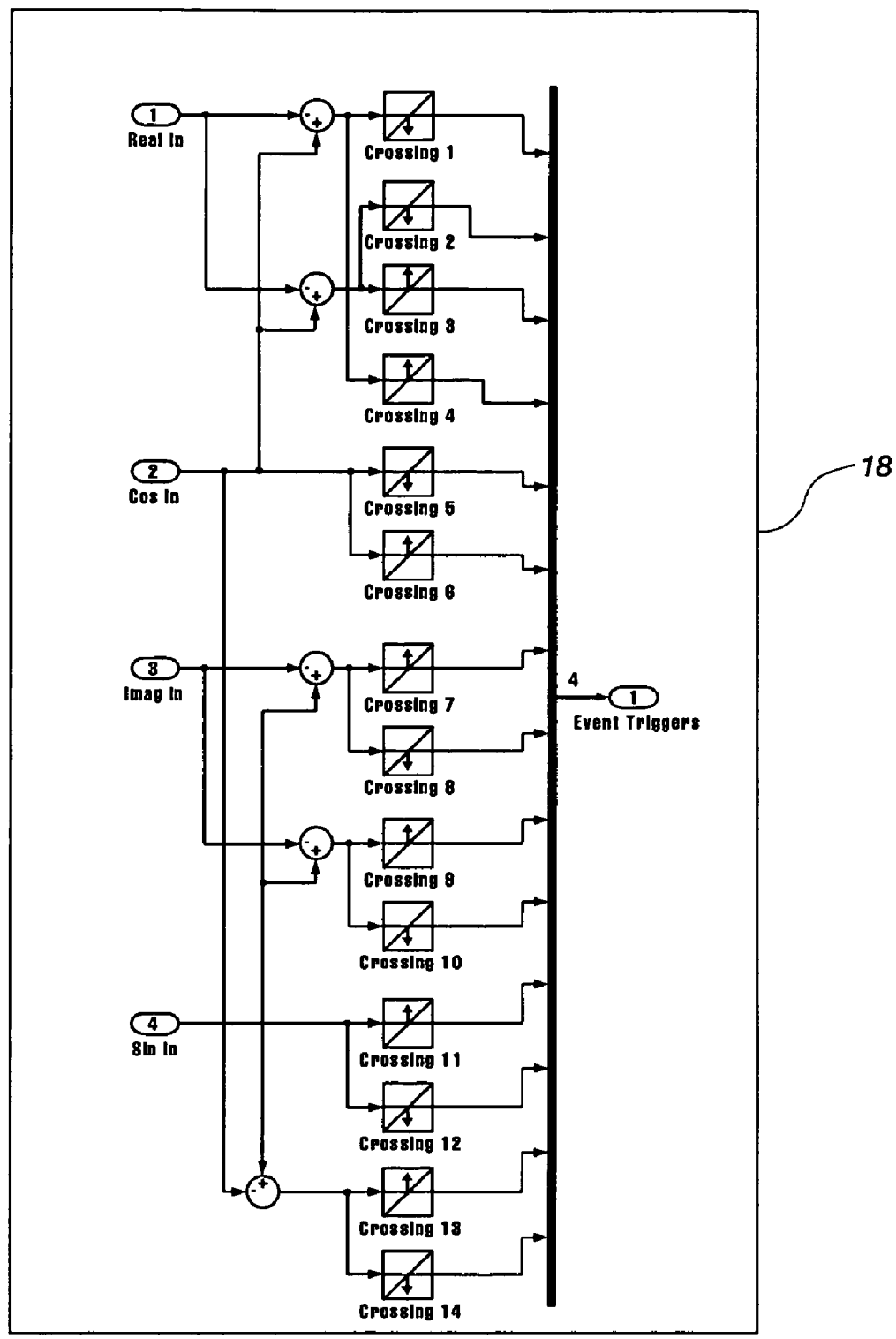
FIG. 12 is a more detailed schematic block diagram illustrating an event generator in one embodiment.

With reference to FIG. 12, each zero crossing detector outputs a short pulse when the input crosses zero in the direction shown. The event trigger signals, from top to bottom in the figure, correspond to the event numbers shown in boxes in FIGS. 10 and 11.

Figure 13:
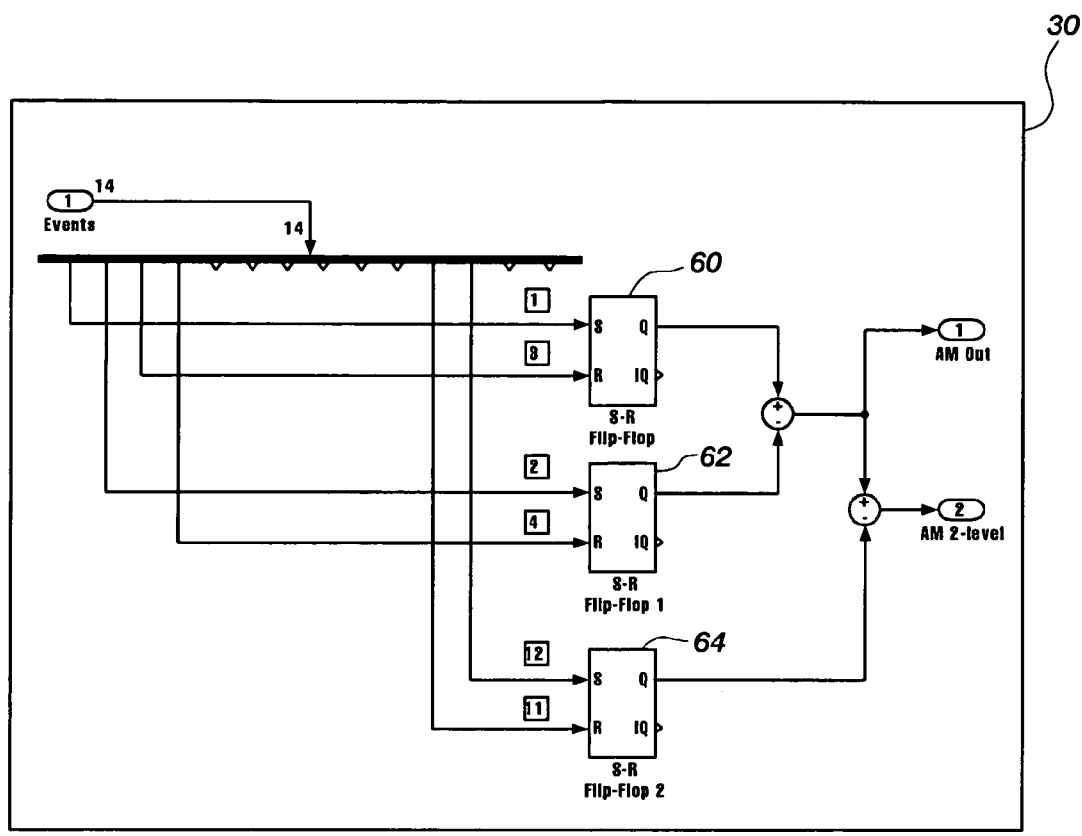
FIG. 13 is a more detailed schematic block diagram illustrating an AM modulator in one embodiment.

Turning to FIG. 13, a DSB (AM) modulator in one embodiment is shown which can be used with the ModAmp embodiment(s) set forth herein. The event triggers set and reset the flip-flops 60, 62, 64 to generate the Tri-Level and Bi-Level AM outputs, using staggered drive, as shown in FIG. 10.

Figure 14:
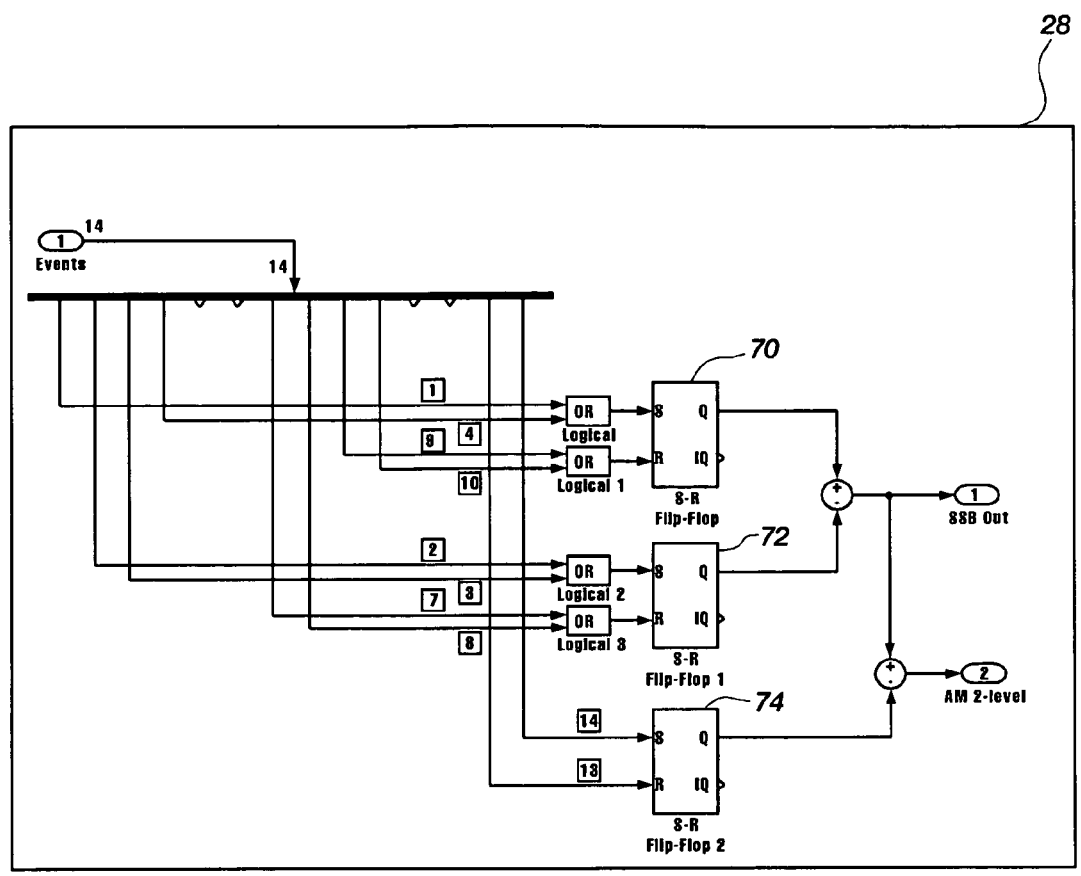
FIG. 14 is a more detailed schematic block diagram illustrating an SSB modulator in one embodiment.

With reference to FIG. 14 a SSB modulator in one embodiment is shown which can be used with the ModAmp embodiment(s) set forth herein. The event triggers set and reset the flip-flops 70, 72, 74 to generate the Tri-Level and Bi-Level AM outputs, using staggered drive, as shown in FIG. 11.

Note that it is not necessary to have a carrier tone present in the modulator output. The AM or SSB signal may have a carrier present, or may be operated in a suppressed carrier fashion. When using the staggered drive we can set the DC bias level to zero so that carrier is suppressed. In the suppressed carrier case any given pulse in the tri-level waveform can be positive going or negative going, depending on the timing order of the staggered drive edges. In the suppressed carrier case, the SSB ModAmp functions as a frequency translating 'bandpass' amplifier. That is, the ModAmp frequency translates the input spectrum to some other band of frequencies as determined by the carrier frequency.

Figure 21:
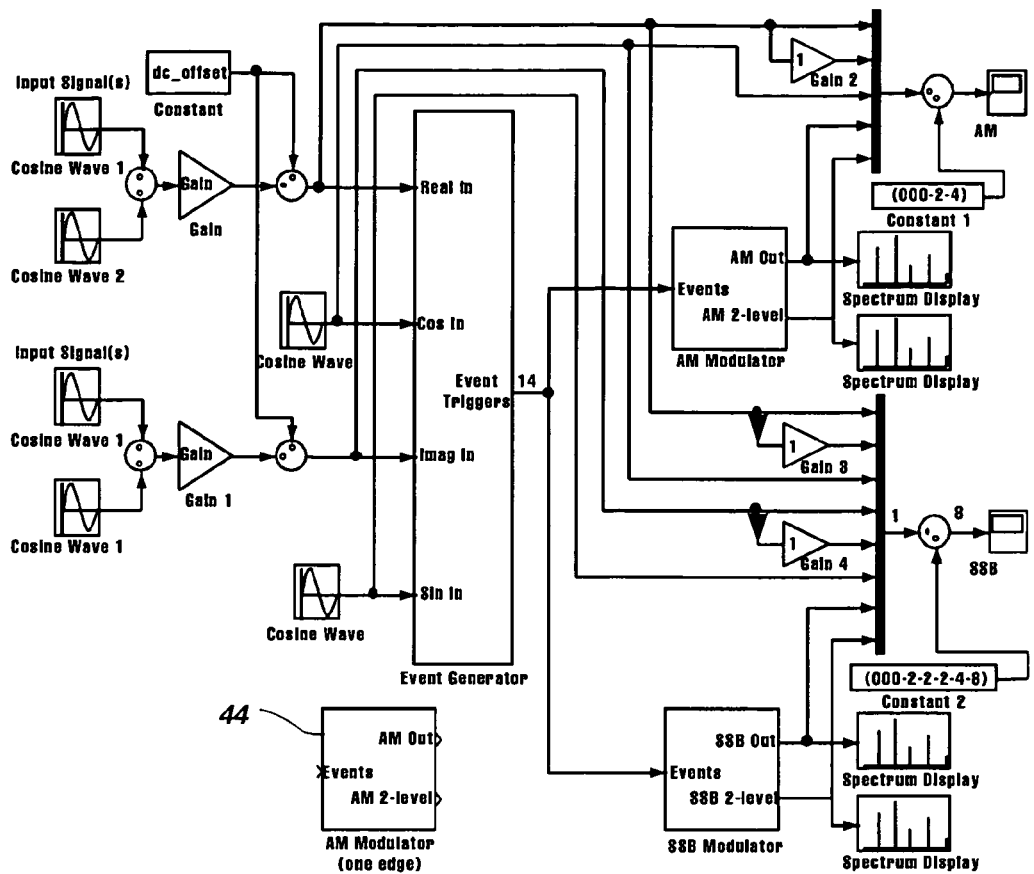
FIG. 21 is a top-level schematic block diagram illustrating an exemplary set-up of a ModAmp in one embodiment.

For true binary output in one embodiment, we want the outputs to take on only two levels. The tri-level AM and SSB waveforms can be converted to bi-level waveforms by adding a square wave at the carrier frequency, which will change the carrier level of the tri-level output. However the DC bias may be changed to allow bi-level operation with or without suppressed carrier. The bi-Level output signal allows an amplifier to be built using a half bridge (instead of a full H-bridge), requiring only two output transistors. The bi-level modulators may also be operated with suppressed carrier by properly setting the DC bias. FIGS. 15–20 show several example simulation results from a generalized ModAmp system. A test set-up used is shown in FIG. 21. The time domain and frequency domain results shown in FIGS. 15–20 were generated by the test ModAmp system illustrated in FIG. 21. In the figures time domain and frequency domain plots are shown for ease of comparison.

Figure 15:
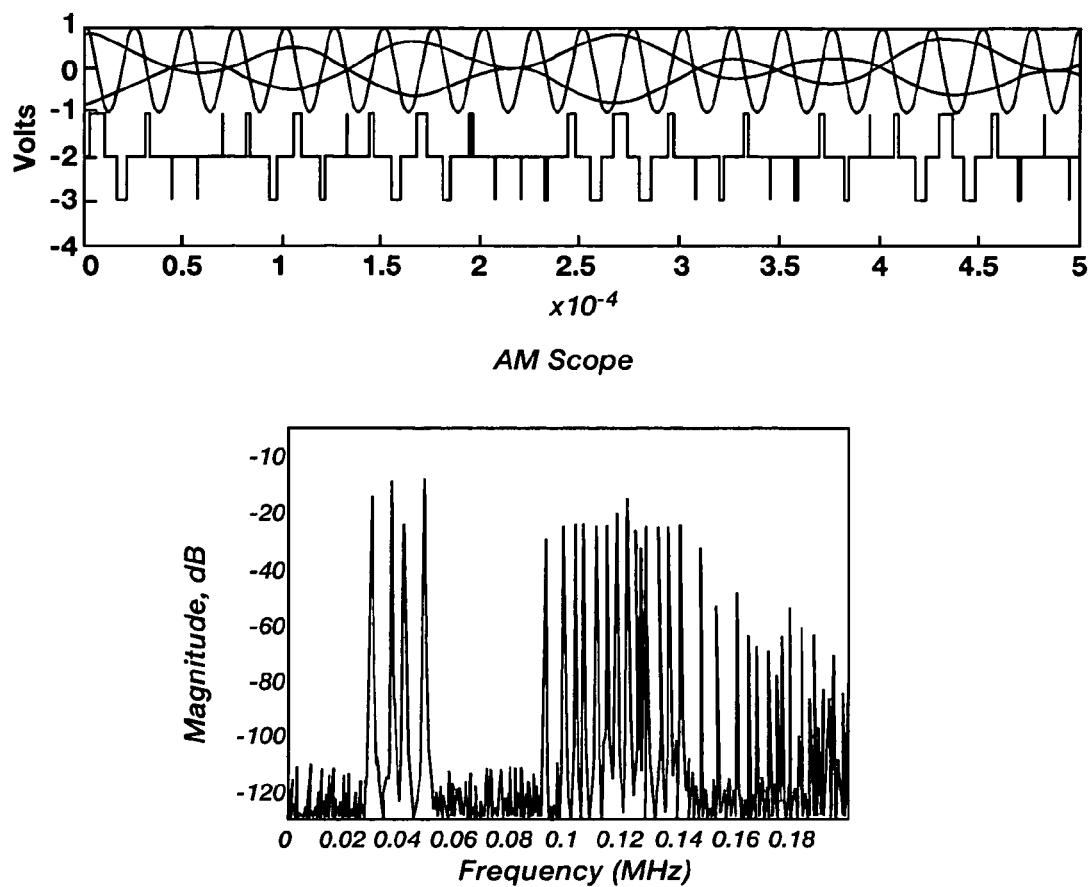
FIG. 15 is a comparison of time and frequency domain plots for an example ModAmp system as shown in FIG. 21 in one embodiment.
Figure 16:
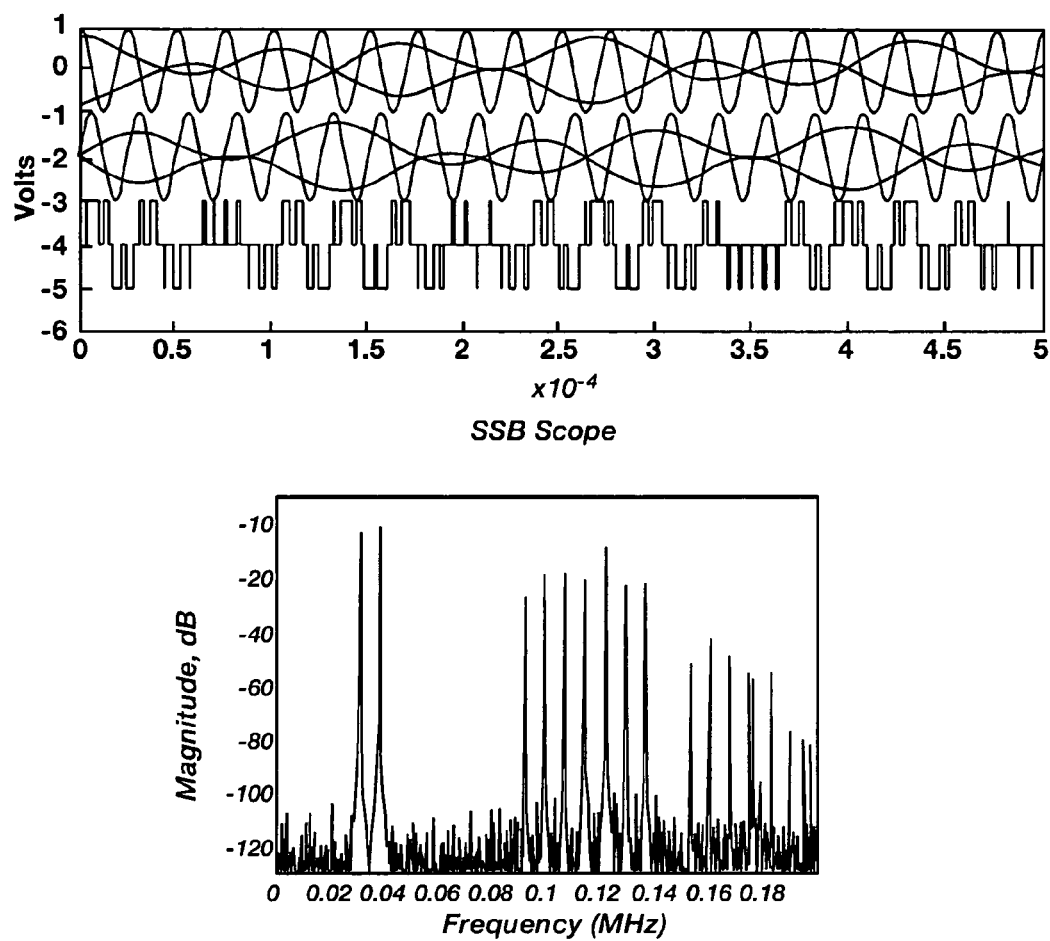
FIG. 16 is a comparison of time and frequency domain plots for an example ModAmp system as shown in FIG. 21 in one embodiment.
Figure 17:
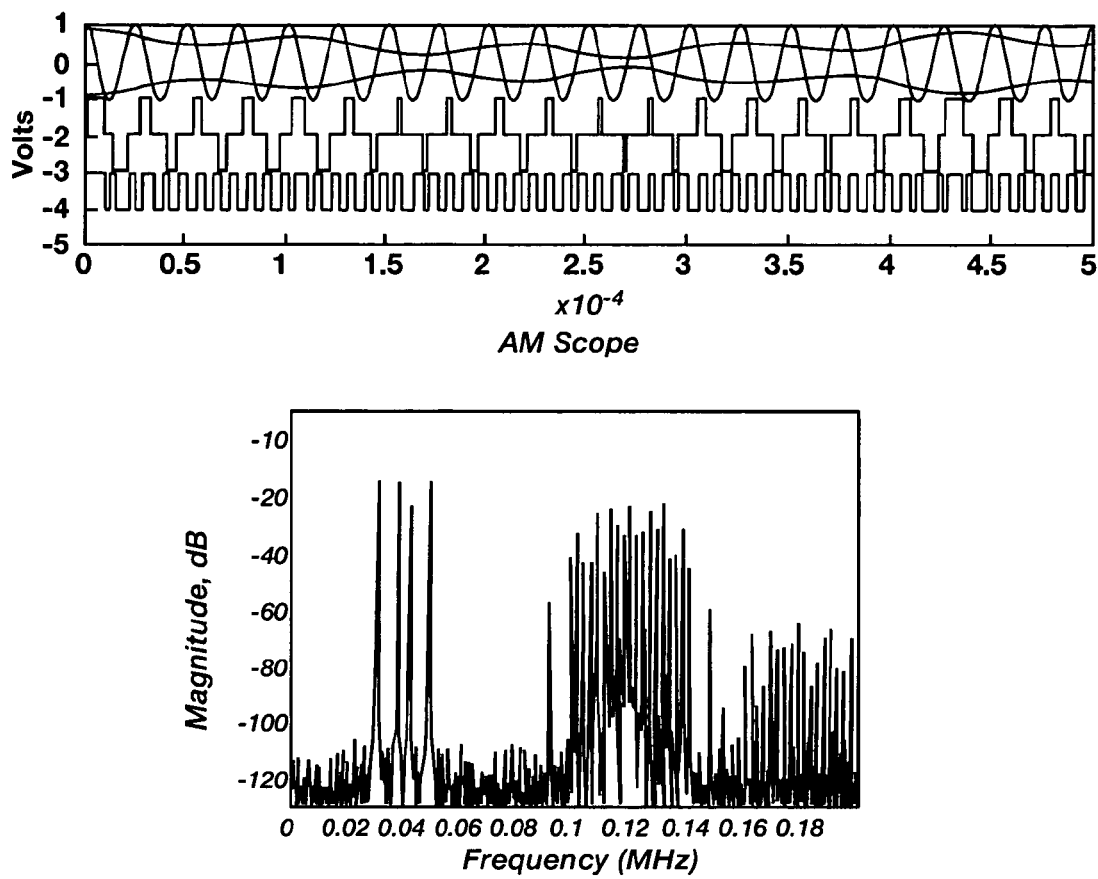
FIG. 17 is a comparison of time and frequency domain plots for an example ModAmp system as shown in FIG. 21 in one embodiment.

FIG. 15 shows Tri-level AM with suppressed carrier. Setting the DC offset constant to zero suppresses the carrier. Turning to FIG. 16, time domain and frequency domain results for Tri-level SSB modulation in the system of FIG. 21 is illustrated. Setting the DC offset constant to zero again suppresses the carrier in this lower sideband modulator example. The time domain plot show the sine and cosine reference waveforms and the in-phase and quadrature input signals. FIG. 17 shows Bi-level AM with suppressed carrier. In this example the DC offset constant is set to 0.5 to achieve that it only has 2 transitions/period (instead of 6 for standard bi-level AM). A drawback of this approach is that it has spectral distortion in the modulated output signal.

With this discussion as background Table 1 summarizes the characteristics of the various modulators. We assume an H-bridge requires 4 MOSFETs and a half H-bridge requires 2 MOSFETs. The "transitions per carrier period" indicate the number of signal transitions of the modulator output per carrier period. The fewer transitions generally yield higher efficiency amplifiers.

Item 5 in Table 1 below uses two bi-level AM modulators and takes the difference to synthesize the SSB output. Item 6 starts with "bi-level AM" and adds a square wave at the 3rd harmonic of the carrier. This is used to reduce the amplitude of the 3rd harmonic in the modulator output. Schemes that add higher order harmonics is also feasible. Item 7 starts with "tri-level AM" and adds a square wave at the 3rd harmonic of the carrier. Item 8 combines two "bi-level AM reduced 3rd harmonic" (item 6) to synthesize the SSB output.

TABLE 1

Characteristics of the various modulators

Figure 18:
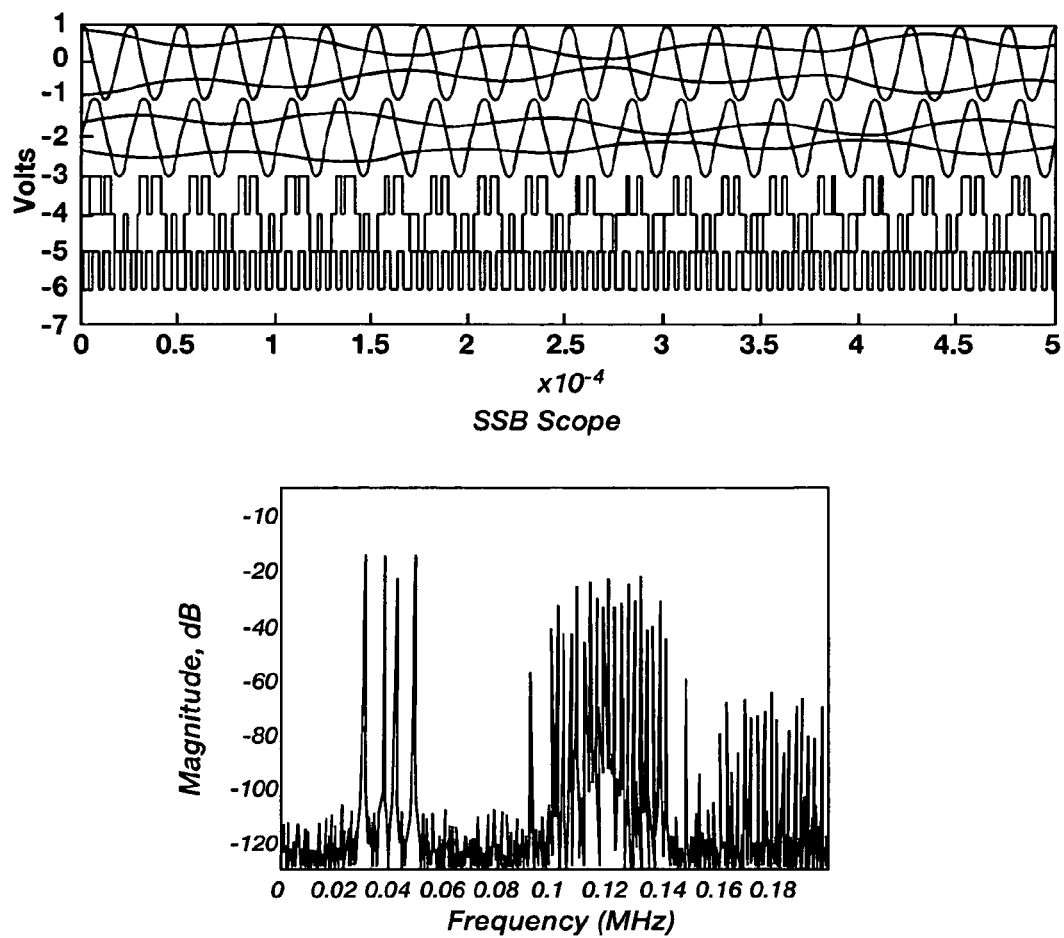
FIG. 18 is a comparison of time and frequency domain plots for an example ModAmp system as shown in FIG. 21 in one embodiment.
Figure 19:
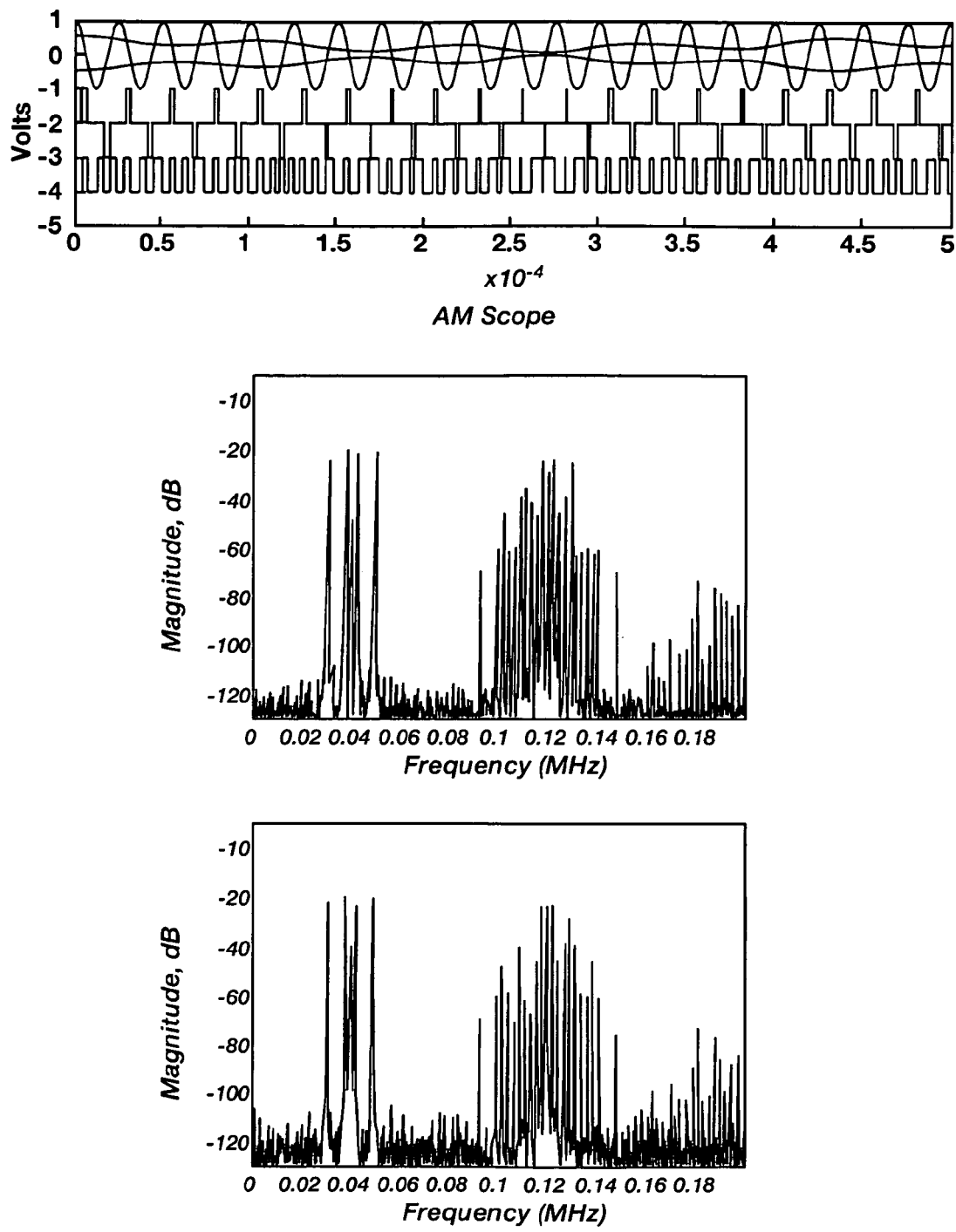
FIG. 19 is a comparison of time and frequency domain plots for an example ModAmp system as shown in FIG. 21 in one embodiment.

| | Modulation Technique | # of Levels seen by load | # MOSFET switches required | transitions per carrier period | (transitions/period) per switch pair | |
|---|---|---|---|---|---|---|
| 1 | Tri-Level AM | 3 | 4 | 4 | 2 | |
| 2 | Tri-Level SSB | 3 | 4 | 8 | 4 | |
| 3 | Bi-Level AM | 2 | 2 | 6 | 6 | |
| 4 | Bi-Level SSB | 2 | 2 | 10 | 10 | |
| 5 | SSB (Bi-Level AM × 2) | 3 | 4 | 12 | 6 | Two independent Bi-Level AM modulators |
| 6 | Tri-Level AM (reduced 3rd harmonic) | 3 | 4 | 8 | 4 | Thus is Bi-Level AM with the 3rd harmonic square wave added. |
| 7 | Bi-Level AM (reduced 3rd harmonic) | 2 | 2 | 10 | 10 | This is Tri-Level AM with the 3rd harmonic square wave added. |
| 8 | SSB (Bi Level AM reduced 3rd × 2) | 3 | 4 | 20 | 10 | | suppressed carrier in the binary waveform, which is shown in the bottom time domain waveform. FIG. 18 illustrates the Bi-Level SSB modulated case with suppressed carrier. The DC offset constant is set to 0.35353535 in the system of FIG. 21. FIG. 19 shows a comparison of the Tri-Level (top spectrum) and Bi-Level (bottom spectrum) AM modulators, with carrier. To achieve the same baseband spectrum in both cases, the DC offset constant is set to 0.255. Note that the 3rd harmonic of the carrier, at 120 kHz is larger for the Bi-Level modulator embodiment. Turning to FIG. 20, the exemplary simulation shows a comparison of the Tri-Level (top) and Bi-Level (bottom) SSB modulators, with carrier. The DC offset constant is set to 0.17676767. Note that in this embodiment the 3rd harmonic of the carrier at 120 kHz is smaller rather than larger for the Bi-Level modulator.

With reference to FIGS. 3 and 21, a Single Edge Modulation alternative is alluded to, and such a modulator (44 in each figure) can be provided. The tri-level AM and SSB modulator output waveforms defined above have both leading and trailing edge modulation. An alternate approach is single edge modulation. For example, we can synthesize a tri-level AM signal with a fixed leading-edge (at the zero crossing of the sine wave) and modulate the timing of only the trailing edge. This single edge modulated AM waveform may be converted to a bi-level waveform by adding a square wave at the carrier frequency. A benefit of this waveform is The output voltage level of the ModAmp will be proportional to the power supply voltage unless we explicitly implement the feedforward technique suggested by equation (10). In the simulations, it was assumed that the power supply voltage was a constant voltage of 1. However, if we modify the ModAmp to monitor the power supply voltage, and make adjustments to the pulse widths, they will automatically compensate for power supply voltage variations and noise (such as the 120 Hz and other AC line harmonics).

Power supply rejection may be achieved by using a feedforward technique where the pulse-width is changed in response to a change in the power supply voltage. From (10) it can be seen that x is scaled by K/V before taking the arcsine. We have assumed that K=1 and V=1 in the system simulations up until now. As the power supply voltage V changes, the pulse widths can be appropriately adjusted to maintain a consistent output.

Figure 22A:
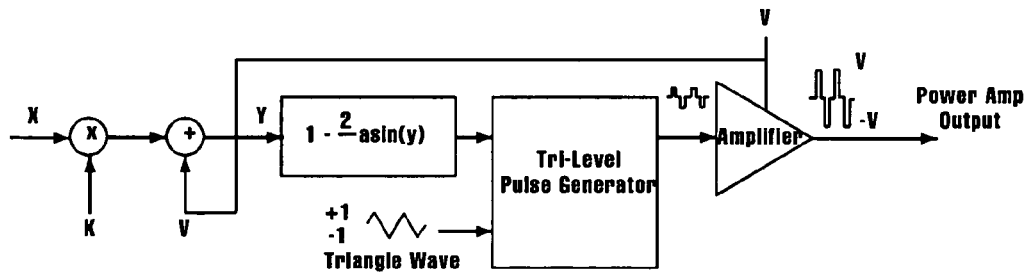
FIGS. 22(a) and (b) are schematic block diagrams of power supply rejection circuits for triangle and sine wave embodiments, respectively.
Figure 22B:
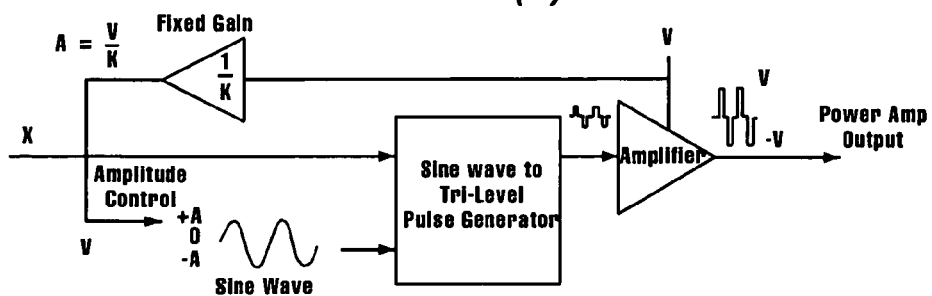

FIG. 22(a) shows a system with power supply rejection circuit that employs a feed-forward amplitude/pulse-width adjustment technique for stabilizing triangle and sinusoidal carrier signals by explicitly implementing equation (10) when using the triangle wave based tri-level pulse generator. An alternative implementation is achieved for the sine wave tri-level pulse generator case. FIG. 22(b) shows a system where the amplitude of the sine wave reference is varied proportionally to the power supply voltage. To see why this works, set the sine wave amplitude parameter to $$A = \frac{V}{K} \qquad (13)$$

substitute it into (12). We get an output amplitude that is independent of the power supply voltage. Specifically, we get the desired linear relationship:

$$a_1 = K \frac{4}{\pi} x \qquad (14)$$

By using one of the feedforward power supply rejection techniques above, the usual requirement of a regulated power supply is eliminated.

Figure 24:
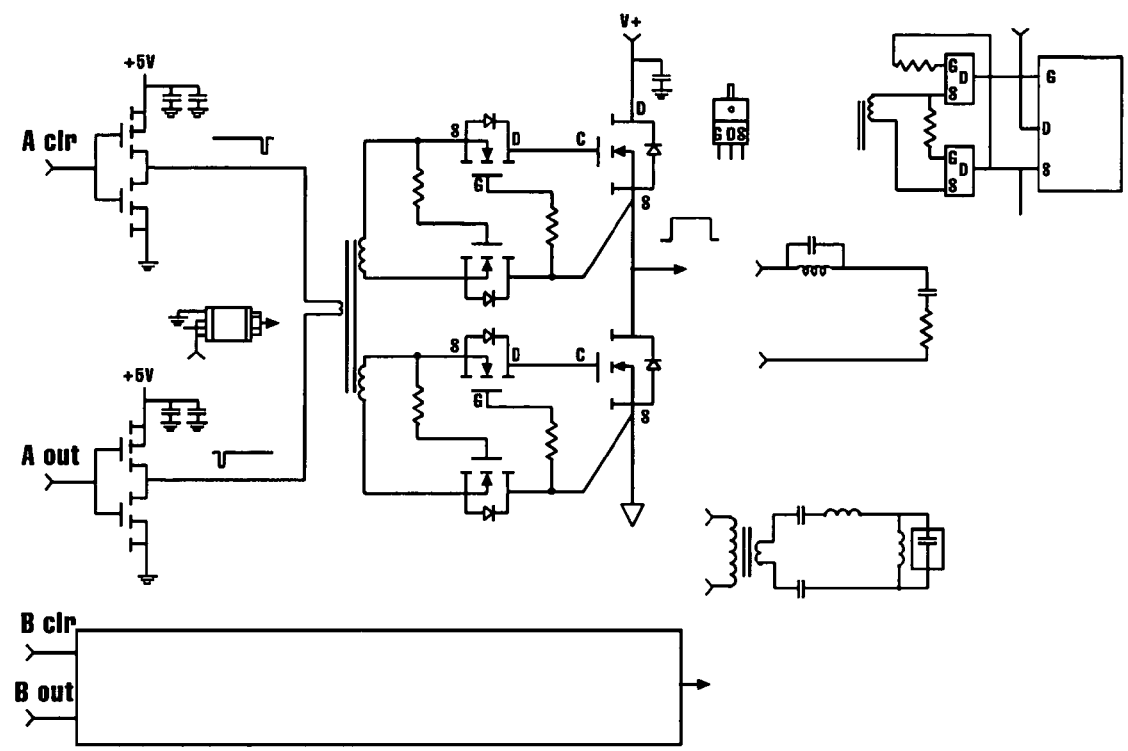
FIG. 24 is a continuation of the diagram of FIG. 23.

An exemplary embodiment of the modulator-amplifier performs tri-level single sideband modulation. The schematic diagram with notes is shown in FIGS. 23 and 24. A master clock oscillator is implemented using comparator, U1. The oscillator runs at four times the carrier frequency. A simple state machine consisting of two D-flip-flops generates a pair of square waves in quadrature at the carrier frequency. Two 4th order lowpass filters are used to filter the harmonics of the square waves, leaving nearly pure sinusoidal tones. The result is the sine and cosine carrier reference signals.

The inputs to the ModAmp consists of in-phase and quadrature (Iin and Qin) audio signals. The input op-amps amplifies and hard-limits the input signals. The op-amp's output voltage is limited at the power supply rails at 0V and +5V. This limiter constrains the tri-level SSB signal's maximum pulse width. After a gain trimming pot, the audio signal is AC coupled with a 1uF capacitor. Next a DC bias is added to set the carrier level. This signal is fed into the upper comparator, U2, and an inverted copy is fed into the lower comparator, U3.

The outputs of the comparators are fed to an edge detector circuit that generates a short 250 nS pulse on both the positive going and negative going comparator transitions. These "event trigger" signals are used to set and clear the A and B halves of the H-bridge.

Shown on the second page of the schematic, a complementary pair of MOSFETs are used to buffer (and invert) the event trigger pulses. The main MOSFETs are driven by a novel circuit design that uses a small pulse transformer and a pair of small MOSFETs to generate the main gate drive signal. Without going into detail, the driver circuit uses the short set and clear pulses to generate bipolar gate drive signals for the main MOSFETs. The driver design avoids cross conduction (or shoot through) of the MOSFETs and operates over a wide duty cycle range.

The output load is connected between the two half bridges to extract the SSB output. In this case, a series inductor forms the lowpass filter. The high-voltage power supply for the output stage is derived by full wave rectifying the 120 V AC line voltage and filtering with a capacitor. The specifications of the ModAmp prototype are shown in Table 2.

TABLE 2

ModAmp Example Specifications

Output power: 200 w
Efficiency: 95–98%
IM Distortion: 0.4% (A 1KHz input produces 39 KHz and 40 KHz Outputs. Distortion measured over DC-60 KHz):
Note that the circuit design minimizes parts count
Input power source: 120 VAC
Physical size: ModAmp: 1.9 × 3.8 × 0.3 inch
Power Supply and Matching Network: 1.9 × 3.8 × 1.2 inch Note that with regard to the modulator output spectrums set forth herein, closed form analytic expressions of the modulator output spectrum can be derived for all the modulation approaches discussed (assuming sine wave input).

To this point it has been assumed that the ModAmps are realized with analog components such as triangle wave oscillators, sine wave oscillators, and comparators, etc. It is feasible, however, to perform all the modulation operations in the digital do-main assuming we have a digital (pulse code modulation (PCM)) input signal.

A digital ModAmp can be realized as follows: (1) up-sample the input PCM waveform, (2) compare the upsampled input to a digitally synthesized sine wave, and (3) use the comparator outputs to generate the driver signals for MOSFET power switches. The problem can be reduced to finding the zero crossing times of the oversampled or interpolated PCM waveforms, (similar to the analog event generator of FIG. 11). To allow accurate calculation of zero crossing times without excessive sampling rates, a root finding method (such as the Newton method) may be used.

Once zero crossing times are calculated, digital PWM logic can generate the output waveforms. If high accuracy timing resolution is required on the edges, an extremely high clock rate would be required for a digital PWM. To alleviate the requirement for excessively high clock rates, techniques such as noise shaping may be applied to dither the timing of the edges (e.g. Delta Sigma modulation).

A Polyphase Variation is also possible in one embodiment. Multiple ModAmps may be paralleled to reduce the output ripple voltage can increase the power. Each amplifier would be operated at a slightly advanced phase from the previous amplifier. The outputs of the "staggered phase" ModAmps would be added together through the output filter inductor, for example. With this polyphase approach, it is also possible to increase the frequency of out-of-band components, thereby reducing the post filtering requirements. An FM Modulator Variation is also another possible embodiment. An FM modulator version of the ModAmp may be implemented using the same elements as the AM version with the following modifications. First, set the input to the ModAmp to a constant. This gives us a constant carrier output. Second replace the oscillator (triangle wave or sine wave depending on the ModAmp) with a voltage controlled oscillator (VC)). Finally use the control input of the VCO as the modulator input.

Note that it is not necessary to use an AM linearizer (since DC is used as an input) or a sine wave oscillator. We simply need to create the tri-level or bi-level waveform that will result in a carrier tone at the fundamental frequency. The VCO performs the FM modulation, the comparators generate the switching signals, and the MOSFETs switches amplify the waveform. The result is an FM ModAmp. Furthermore, this basic principle can be extended to other modulation schemes such as quadrature phase shift keying (QPSK), quadrature amplitude modulation (QAM), etc.

Now further embodiments will be discussed, and some overlapping of the previous discussion will be included. However, additional understanding will be imparted by consideration of the following discussion.

Figure 25:
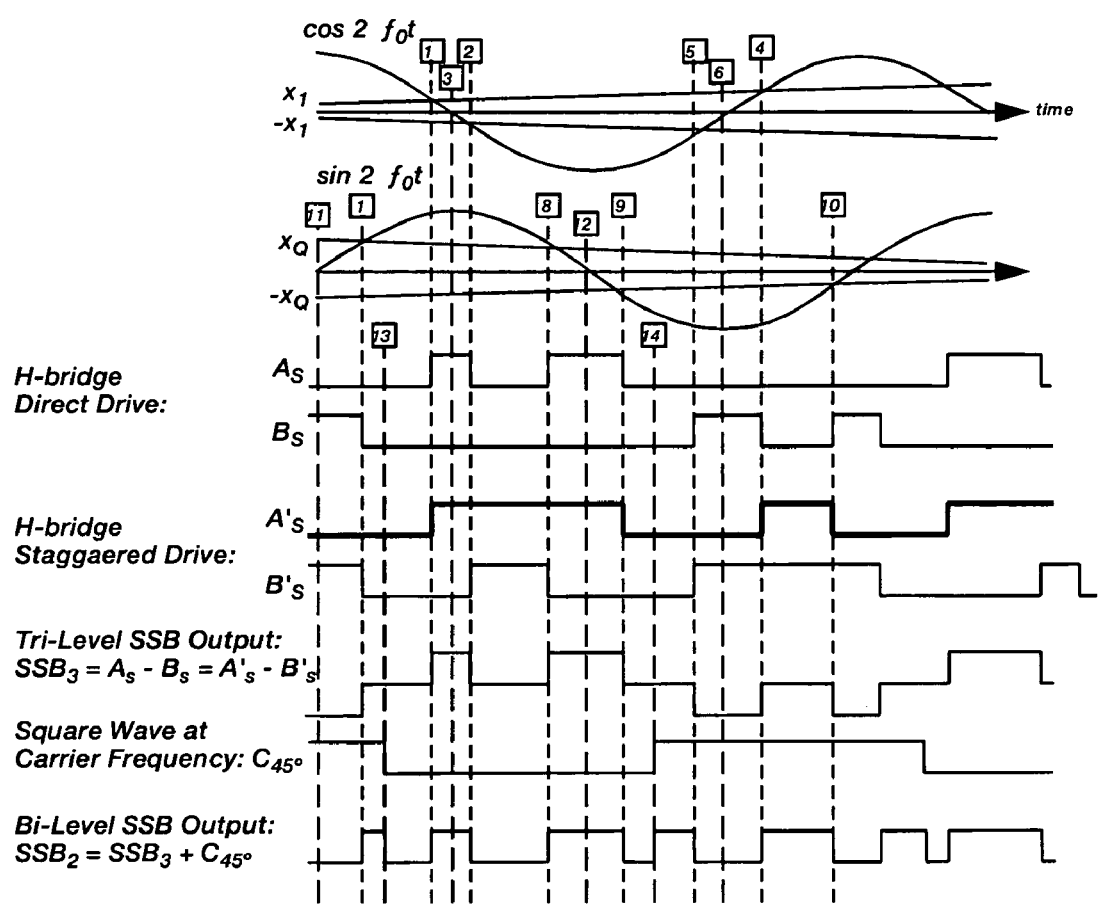
FIG. 25 is a comparison of waveforms in a ModAmp in one embodiment.

With reference to FIG. 25, signals for single sideband (SSB) synthesis. In this case, sine and cosine waves are compared to the input signals consisting of in-phase and quadrature components (90 degrees out of phase from one another). The in-phase and quadrature components are typically derived by using a Hilbert transformer. Fourteen events are defined in the figure at crossings of the input signals with the sine waves or at zero crossings of the sine waves.

Figure 26:
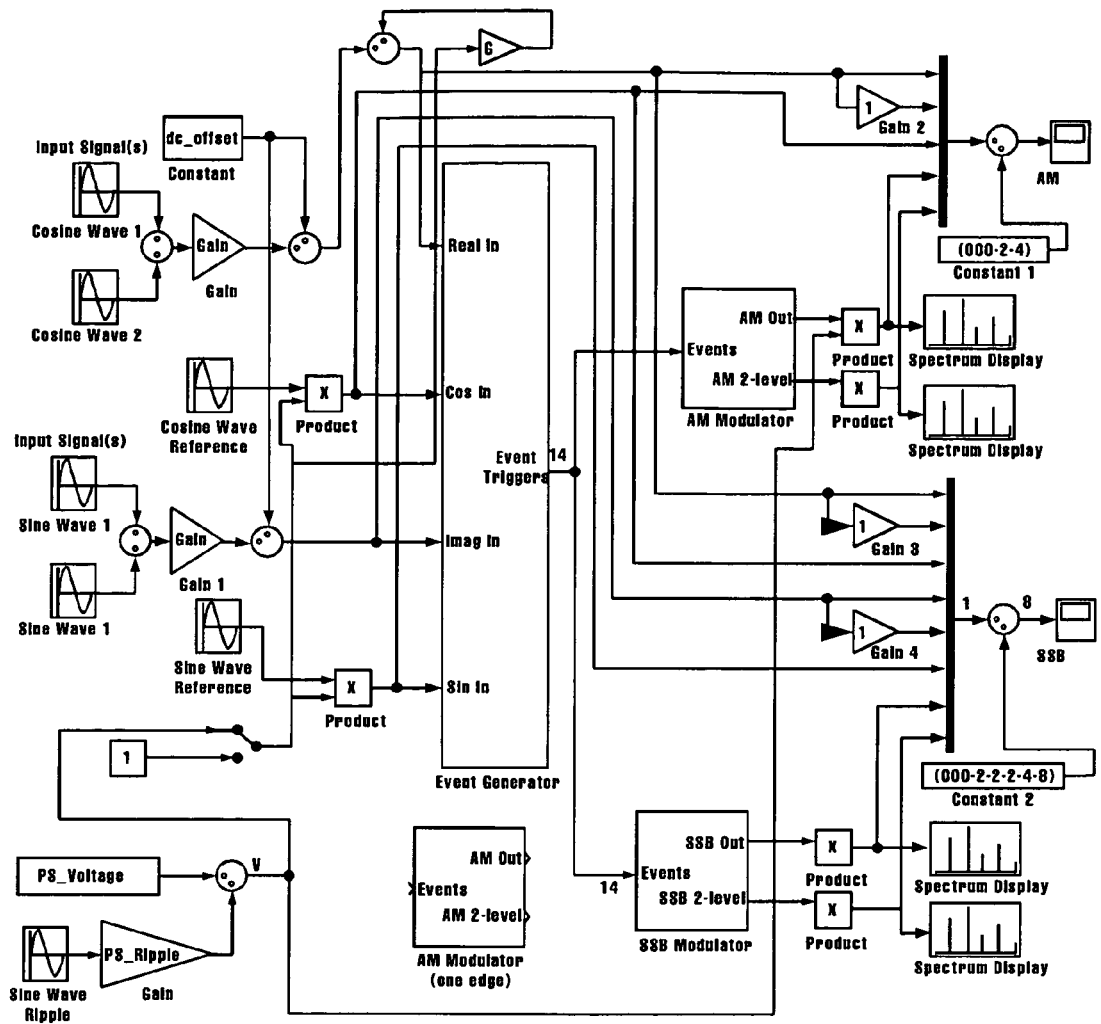
FIG. 26 is a top-level schematic block diagram illustrating an exemplary set-up of a ModAmp in one embodiment.
Figure 27:
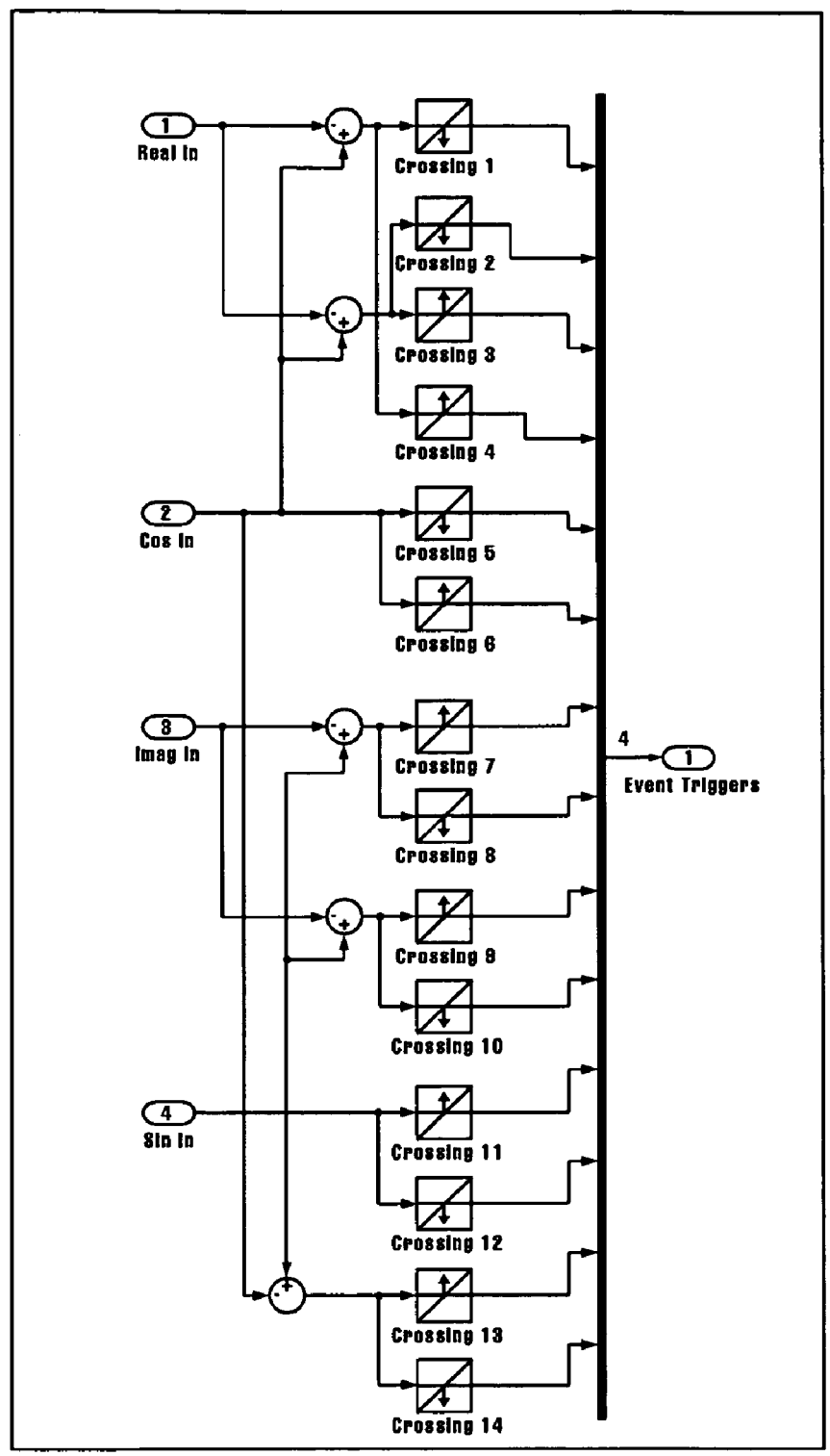
FIG. 27 is a more detailed schematic block diagram illustrating an event generator in one embodiment.
Figure 28:
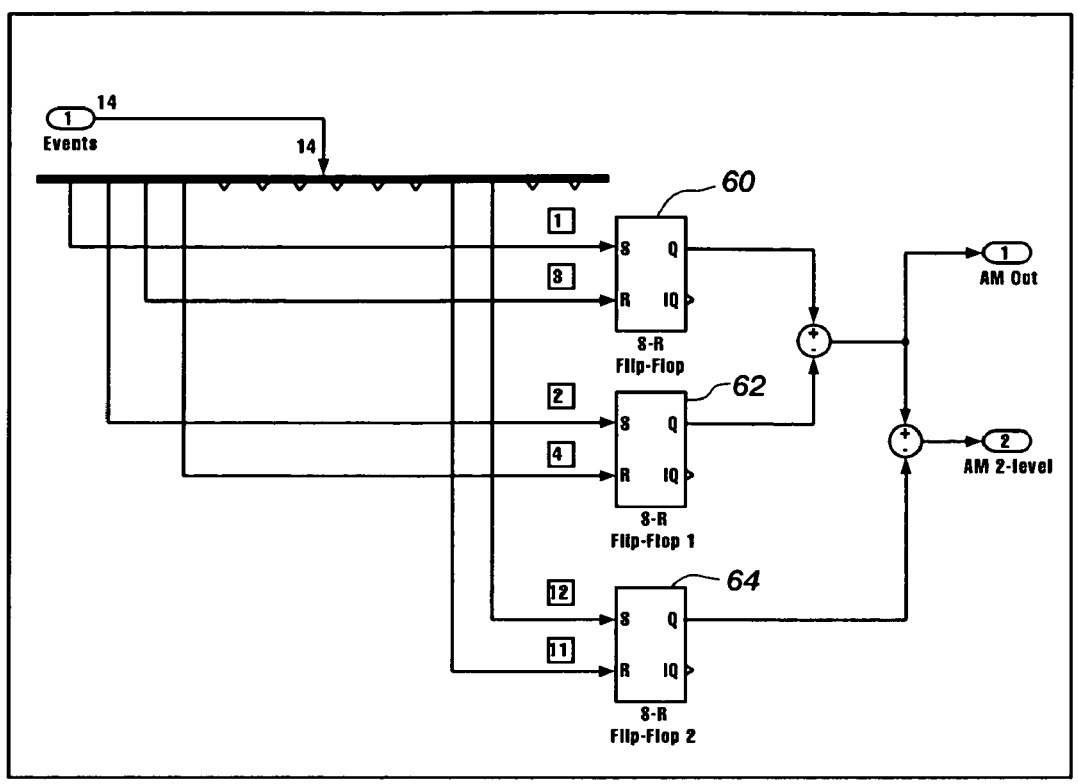
FIG. 28 is a more detailed schematic block diagram illustrating an AM modulator in one embodiment.
Figure 29:
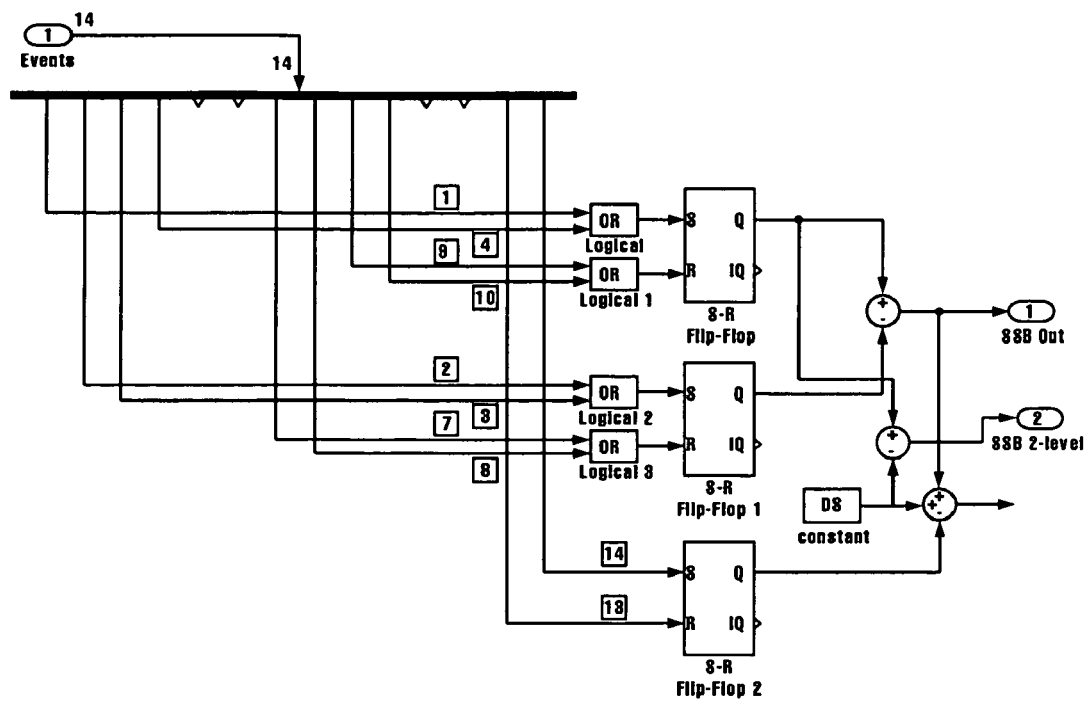
FIG. 29 is a more detailed schematic block diagram illustrating an SSB modulator in one embodiment.

FIG. 26 shows the top-level block diagram of the modulator/amplifier in another embodiment. Sinusoidal input test signals are generated in quadrature and drive the real and imaginary inputs of the Event Generator block, detailed in FIG. 27. The event generator derives a series of 14 short pulses, or event triggers, that are used by the AM and SSB modulators. The AM and SSB modulators are detailed in FIG. 28 and FIG. 29, respectively.

For binary output, we want the outputs to take on only two levels. The tri-level AM and SSB waveforms can be converted to bi-level waveforms by adding a square wave at the carrier frequency, as shown at the bottom of FIG. 25. Alternatively, the bi-Level signal labeled as A'$_S$ (the bold waveform) in FIG. 1 yields the desired SSB output. The bi-Level output signal allows an amplifier to be built using a half bridge (instead of a full H-bridge) requiring only two output transistors.

Figure 30:
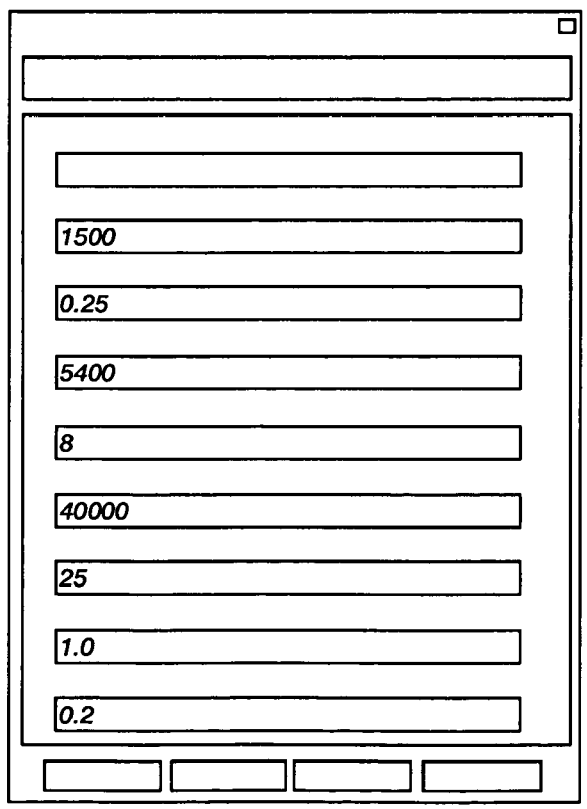
FIG. 30 is a screen shot of settings for a simulation in accordance with one embodiment.
Figure 31:
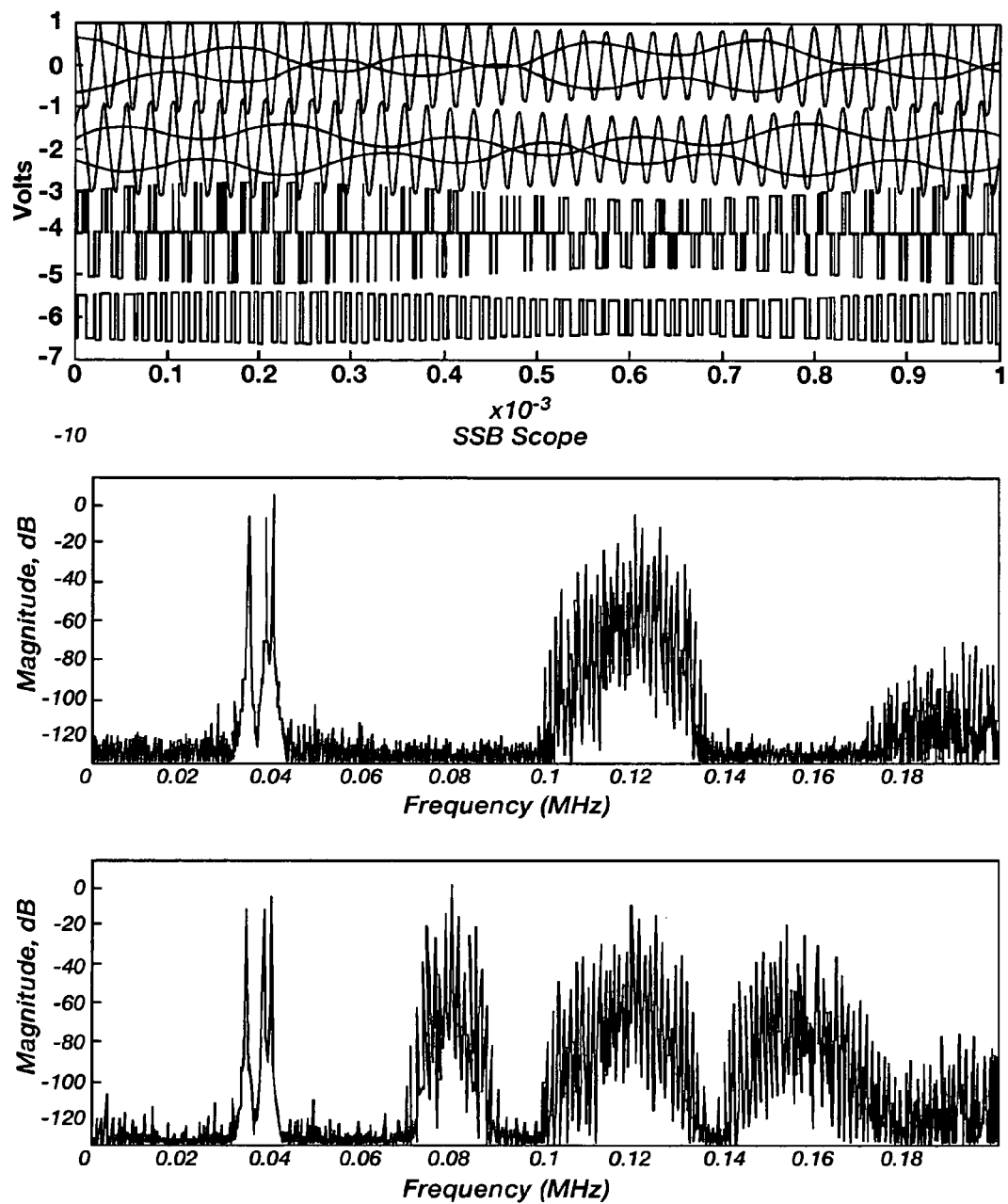
FIG. 31 is a comparison of time and frequency domain plots for an example ModAmp system as shown in FIG. 21 in one embodiment.

A simulation was run with two test tones using the parameter settings shown in FIG. 30. The top of FIG. 31 shows the time domain waveforms for tri-level and A'$_S$-bi-Level modulation. The remainder of FIG. 31 shows the spectrum for the two cases. Notice that the A'$_S$-bi-Level modulation has out-of-band signals centered around 80 KHz. Since the PVDF transducers used in our application have negligible output above 55 KHz, we use the simple A'$_S$-bi-Level modulation scheme in the Analog ModAmp.

Figure 32:
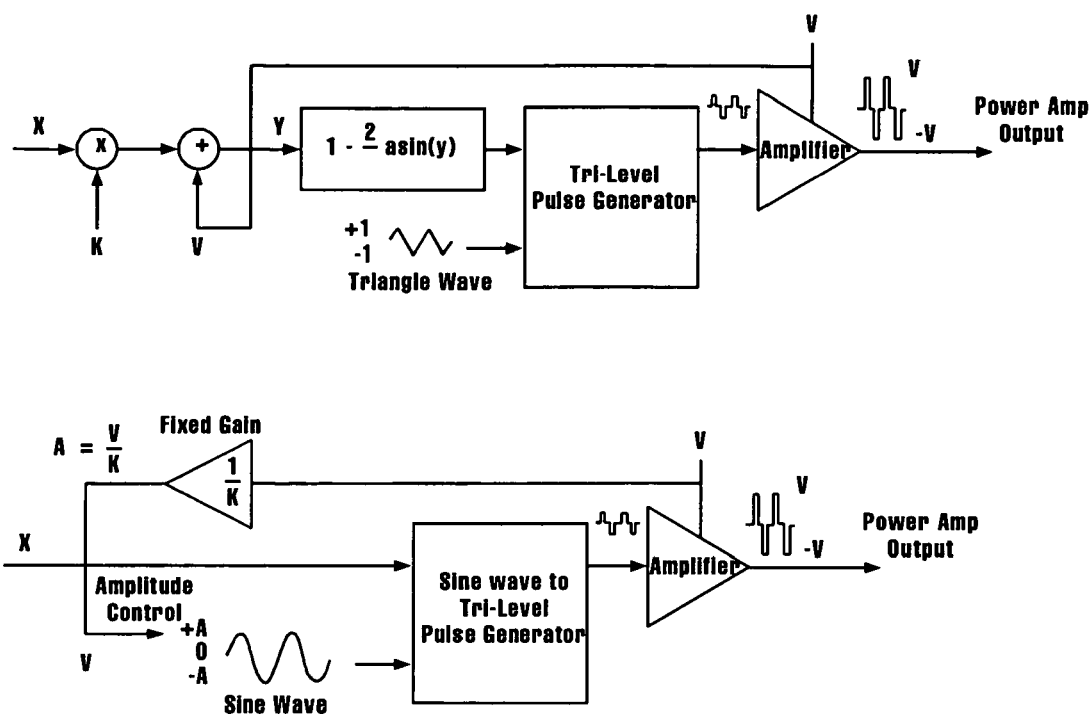
FIG. 32 is a schematic block diagram of power supply rejection circuits for triangle and sine wave embodiments, respectively.

The power supply noise/ripple rejection approach of FIG. 32 is used in the Analog ModAmp. It was shown in the invention disclosure document that if the reference oscillators' amplitudes are controlled in proportion to the MOSFET power supply voltage, then we achieve an output that is independent of the supply voltage.

Table 3 summarizes the characteristics of the various modulators. We assume an H-bridge requires 4 MOSFETs and a half-bridge requires 2 MOSFETs. The "transitions per carrier period" indicate the number of signal transitions of the modulator output per carrier period. The fewer transitions generally yield higher efficiency amplifiers. Item 5 uses two bi-level AM modulators and takes the difference to synthesize the SSB output. Item 6 starts with "bi-level AM" and adds a square wave at the 3rd harmonic of the carrier. This is used to reduce the amplitude of the 3rd harmonic in the modulator output. Schemes that add higher order harmonics is also feasible. Item 7 starts with "tri-level AM" and adds a square wave at the 3rd harmonic of the carrier. Item 8 combines two "bi-level AM reduced 3rd harmonic" (item 6) to synthesize the SSB output. Item 9 is the new technique used in the Analog ModAmp described in this document.

TABLE 3

Characteristics of the various modulators

| | Modulation Technique | # of Levels seen by load | # MOSFET switches required | transitions per carrier period | (transitions/period) per switch pair | |
|---|---|---|---|---|---|---|
| 1 | Tri-Level AM | 3 | 4 | 4 | 2 | |
| 2 | Tri-Level SSB | 3 | 4 | 8 | 4 | |
| 3 | Bi-Level AM | 2 | 2 | 6 | 6 | |
| 4 | Bi-Level SSB | 2 | 2 | 10 | 10 | |
| 5 | SSB (Bi-Level AM × 2) | 3 | 4 | 12 | 6 | Two independent Bi-Level AM modulators |
| 6 | Tri-Level AM (reduced 3rd harmonic) | 3 | 4 | 8 | 4 | This is Bi-Level AM with the 3rd harmonic square wave added. |
| 7 | Bi-Level AM (reduced 3rd harmonic) | 2 | 2 | 10 | 10 | This is Tri-Level AM with the 3rd harmonic square wave added. |
| 8 | SSB (Bi Level AM reduced 3rd × 2) | 3 | 4 | 20 | 10 | |
| 9 | Bi-Level SSB base on A' drive signal | 2 | 2 | 4 | 4 | This technique first described in this document. Has 80 KHz noise component (for 40 KHz carrier |

Figure 33:
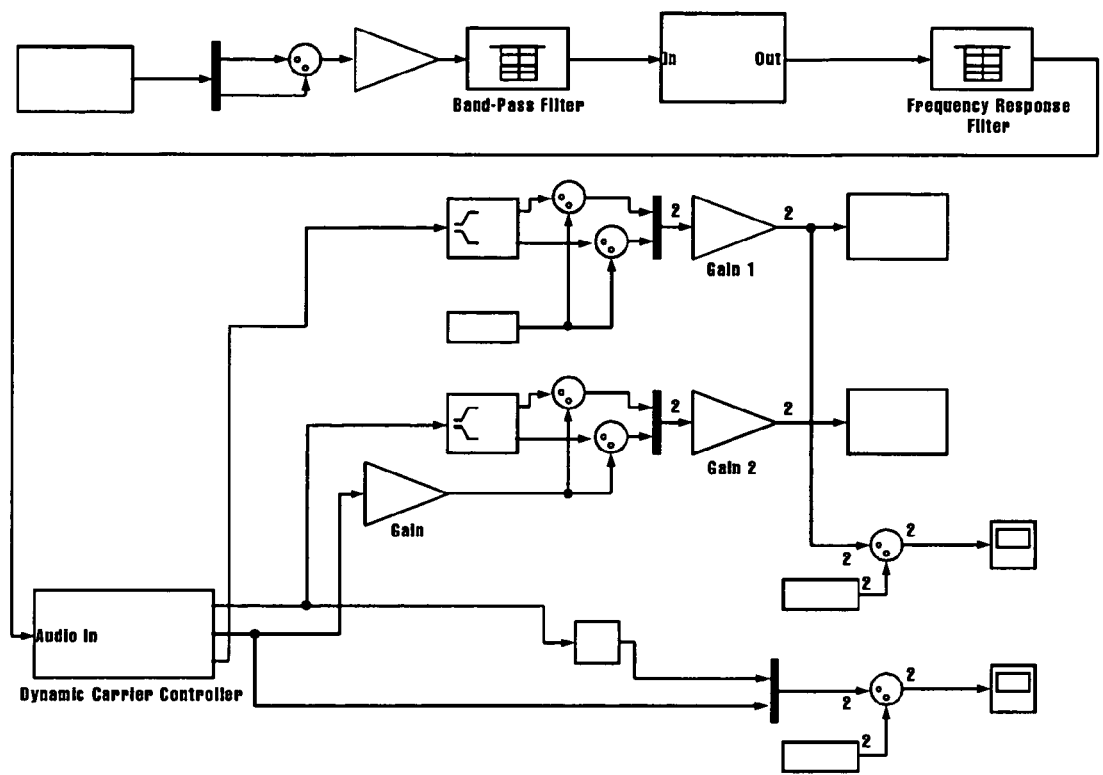
FIG. 33 is a block diagram illustrating a pre-processor in one embodiment.
Figure 34:
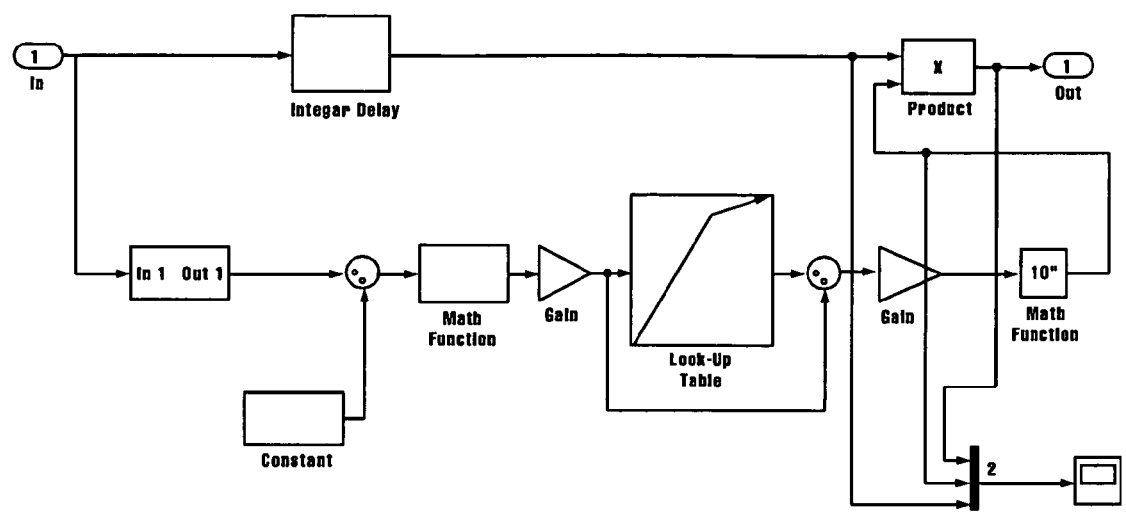
FIG. 34 is a block diagram illustrating a dynamic range compressor component of the system in one embodiment.
Figure 35:
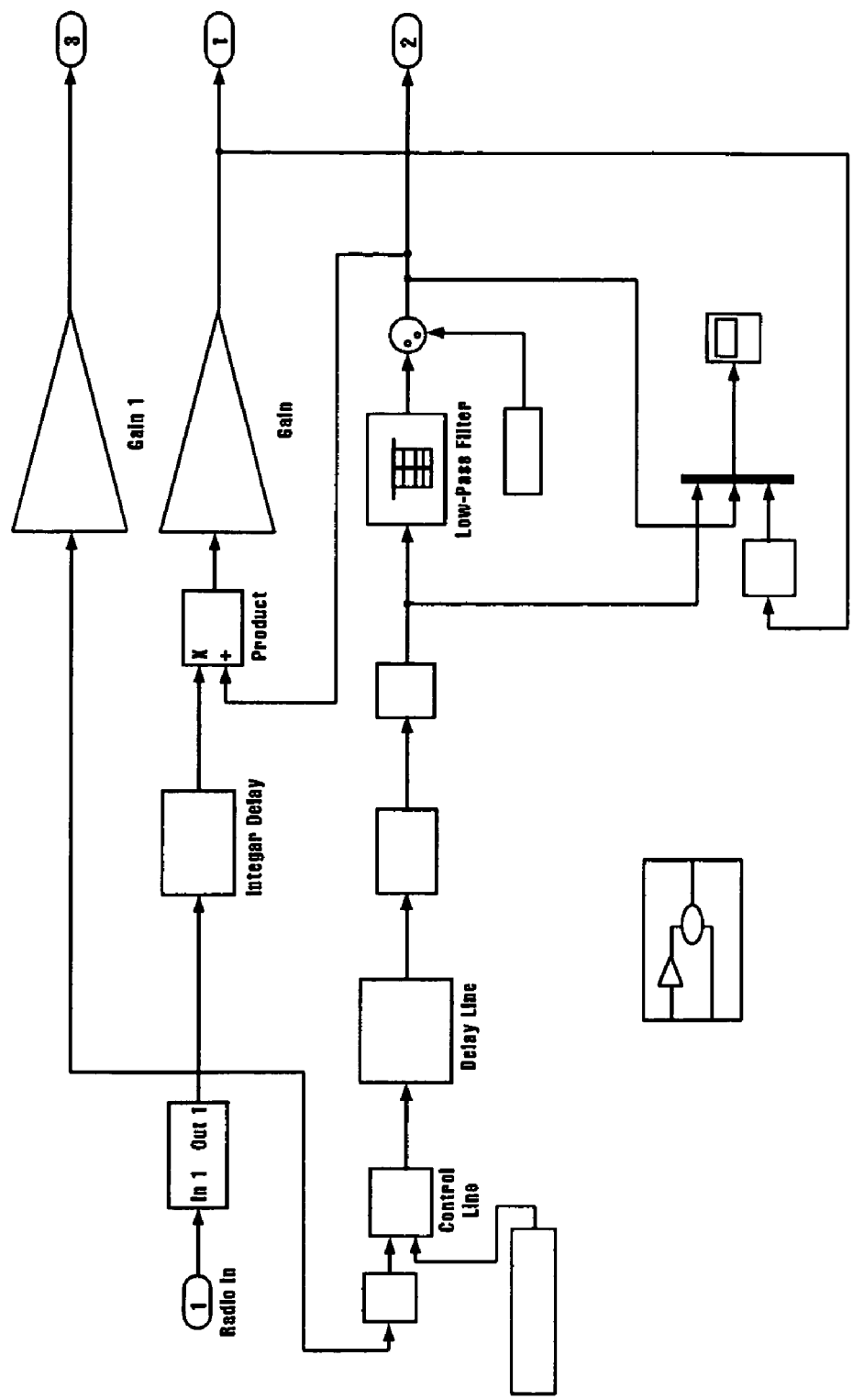
FIG. 35 is a block diagram illustrating a dynamic carrier controller in one embodiment.

Regarding Pre-Processing Software for the Analog ModAmp, The source audio material is processed on a computer to generate an I (in-phase) and Q (quadrature) signals that are saved on the MP3 players right and left channels, respectively. The software is written in MATLAB/Simulink and the block diagrams are shown in FIG. 33, FIG. 34 and FIG. 35.

In another embodiment, an Analog ModAmp Circuit Description is illustrated in FIGS. 36–39. This amplifier accepts analog I and Q signals from an MP3 Player. These signals are DC coupled so the carrier level can be controlled dynamically from the pre-processor software output. An MP3 player must be used that preserves the DC term. The Samsung YP-30S was selected for this application. The Analog ModAmp was designed and built that performs bi-level lower-sideband modulation. The circuits are described in the following paragraphs.

Figure 36:
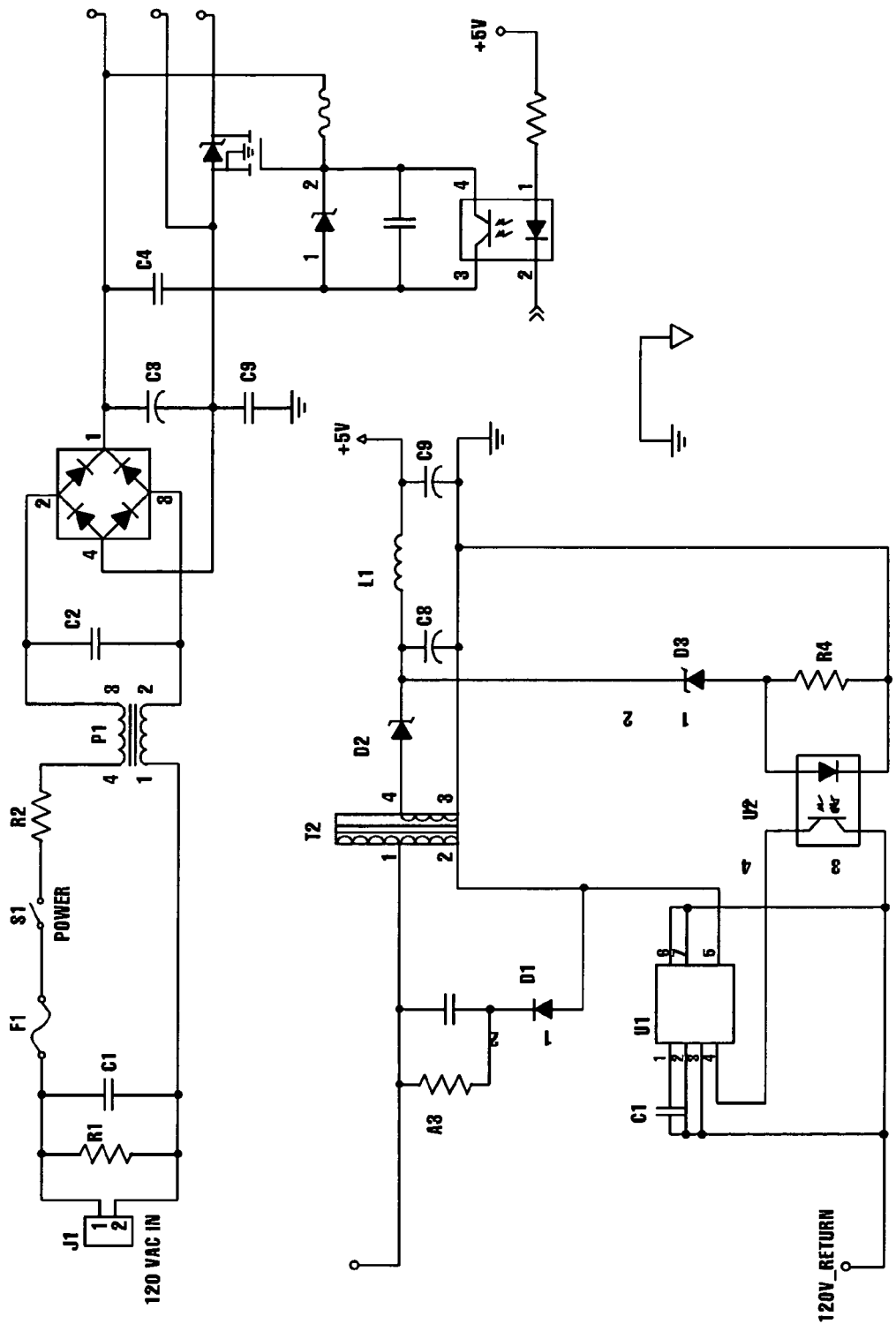
FIG. 36 is a schematic diagram of a modulator-amplifier in one embodiment.

The power supplies are shown in the schematic in FIG. 36. The high voltage power supply is a simple off-line supply consisting of EMI filter components, a full wave bridge rectifier and filter capacitors. This high voltage supply powers the main MOSFETs and the auxiliary power supply. The auxiliary supply produces 5V for the ModAmp's control circuitry and the MP3 player. It is based on the Power Integrations TNY264 fly-back regulator chip. This chip packs all the control logic and the main switch for the complete transformer isolated fly-back power supply.

Sine/Cosine Reference Oscillators are implemented as follows: the master clock oscillator is the LTC 1799 chip, U5, in FIG. 37. The inductor L7 ensures that oscillator noise is not conducted into the 5V supply. The oscillator runs at four times the carrier frequency. A simple state machine consisting of two D-flip-flops, U6, generates a pair of square waves in quadrature at the carrier frequency. Two 4th order Chebyshev lowpass filters consisting of U7, U8 and associated R's and C's, are used to filter the harmonics of the square waves, leaving nearly pure sinusoidal tones. The result is the sine and cosine carrier reference signals. DC blocking capacitors C 17 and C 25 decoupled the accumulated offset error in the filter. A final gain stage, U9, is used to boost the signal level.

Figure 37:
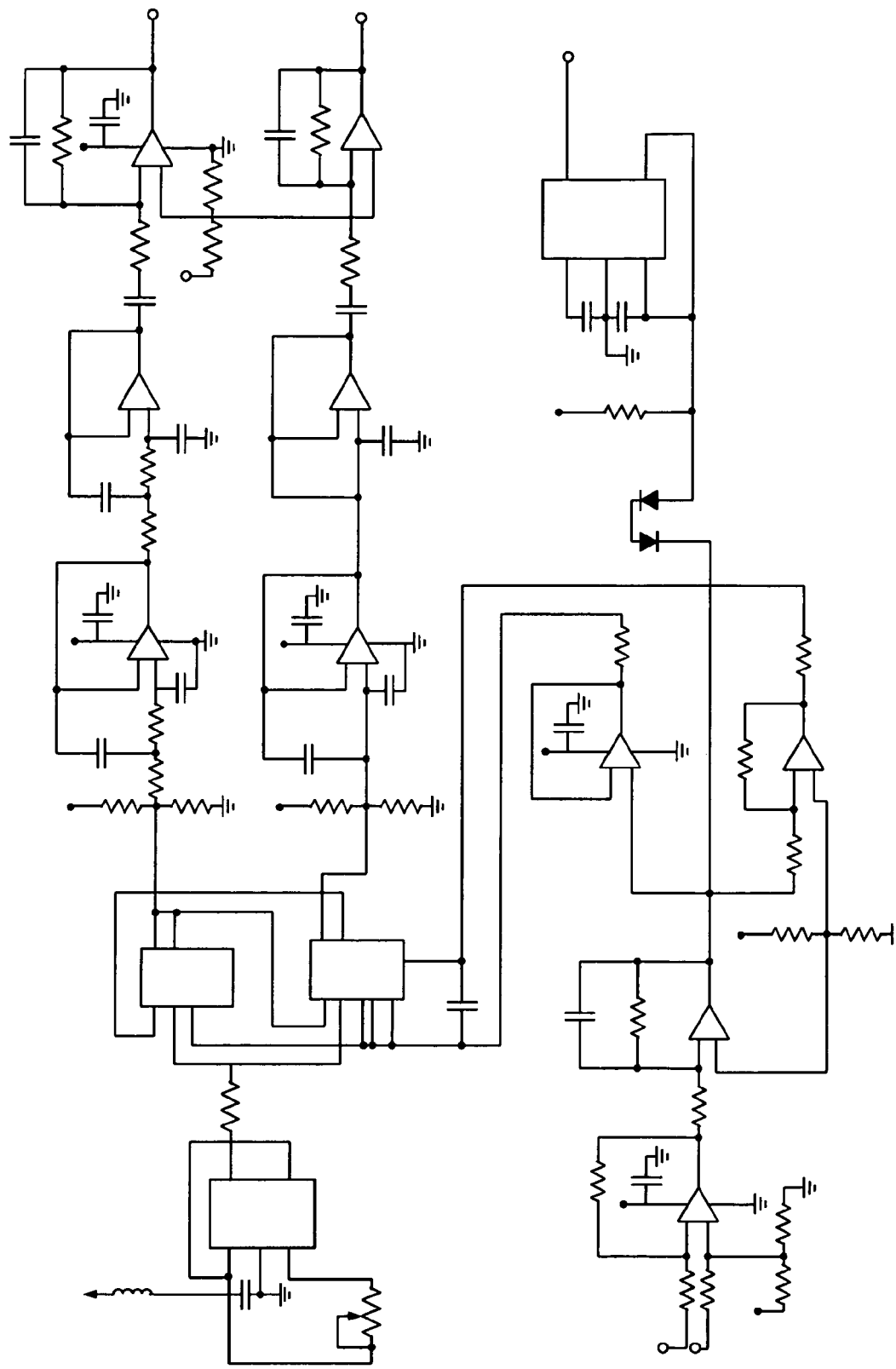
FIG. 37 is a continuation of the diagram of FIG. 36.
Figure 38:
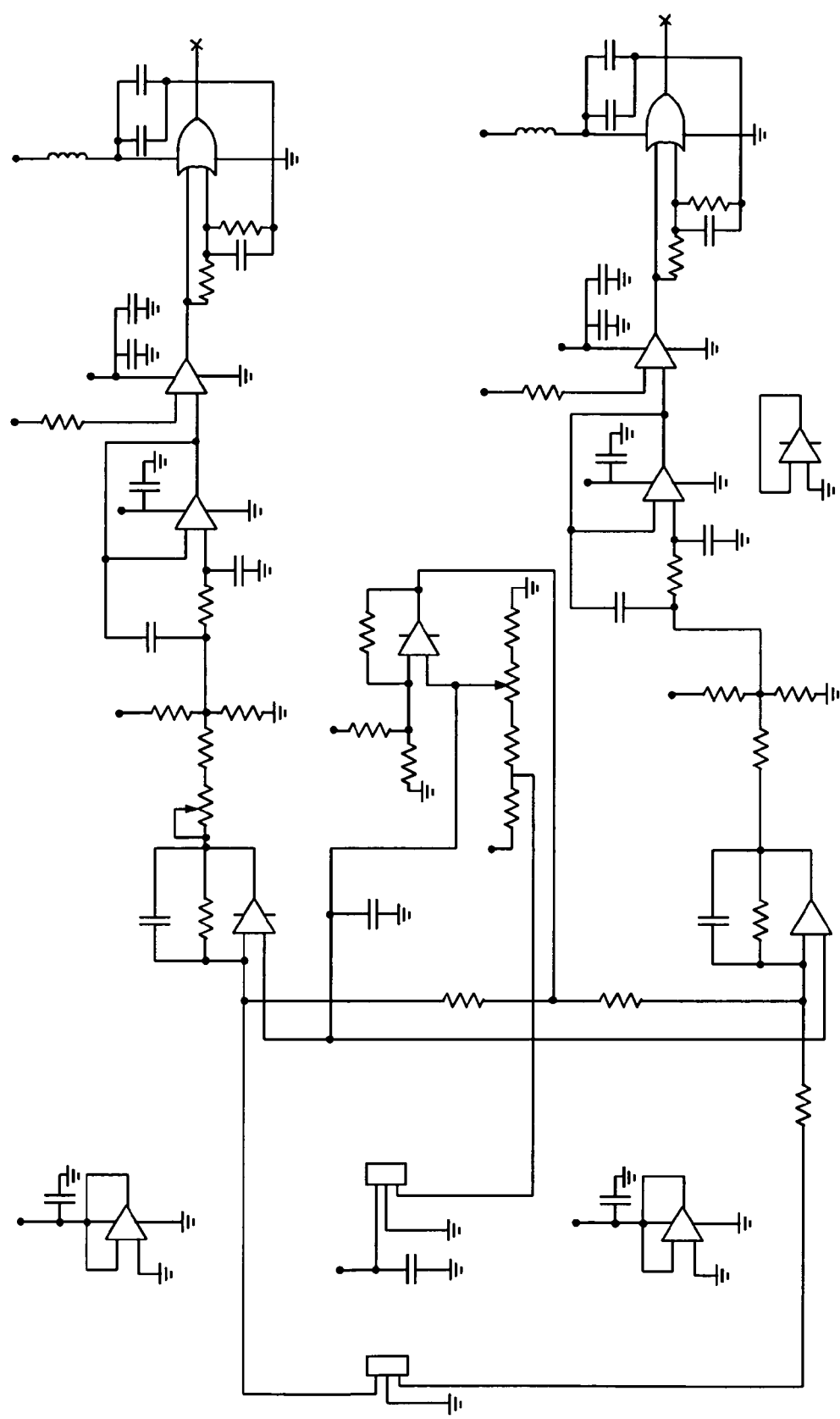
FIG. 38 is a continuation of the diagram of FIGS. 36 and 37.

The circuits in the lower half of FIG. 37 consisting of U10 and U11 are the power supply rejection circuits. These circuits force a symmetric power supply voltage across the D-Flip-flops that is proportional to the high voltage power supply. Since the outputs of the D-Flip-flops swing from rail-to-rail, the quadrature square wave output amplitudes are proportional to the high voltage supply. And finally, the sine and cosine output amplitudes will be proportional to the high voltage supply, as desired.

The circuit gains are set such that the output sine waves will clip with high input line voltages. This clipping has no negative consequence since the peaks of the waveforms are not used by the subsequent comparator circuits. The increased amplitude in the design increases the overall dynamic range.

A Reset/brown out protection circuit can be provided in one embodiment. The reset chip U22 triggers a 2 second active low reset pulse on power up. If the VCC input drops below 4.00V reset is also asserted. The RESET_F signal, when active, disables the high voltage power supply to the main MOSFETs through the switch, Qa in the power supply schematic, FIG. 36. This system is used to delay the power-up of the main MOSFETs until the 5V supply has stabilized and the MOSFET drive signals are valid. This circuit also shuts down the MOSFET power supply under brown-out conditions where the AC line is below about 80VAC. The design performs the brown-out reset using the diodes D4 to drag down the reset chip's VCC input when the high voltage supply droops. This reset behavior is important since the sine wave reference signals are proportional to the high voltage and lowered reference signals would eventually lead to invalid control waveforms at the comparator outputs.

The inputs to the ModAmp consist of in-phase and quadrature audio signals with DC controlling the carrier level. The circuits of U12, U17 and U14B in FIG. 14 take the MP3 player input and generate a hard-limited (0 to 5V) signal that is nominally at +5V/2 (2.5V) with no input signal. Clipping excessive input levels is critical at this stage to avoid invalid comparator outputs in the subsequent circuits.

The op-amp circuit design takes the ratiometric signal from the MP3 player output (the DAC in the player is proportional to the 2.47V reference times the digital code) and generates an output that drops below the nominal 2.5V as the carrier level increases. The circuit is designed to cancel the offset voltage errors that would normally occur with +5V power supply variations.

Regarding PanComparator Circuits included in the illustrated embodiment, the 15 KHz 2nd order Bessel lowpass filter U14A and U19A removes high frequency signals that may be in the input and drives the negative comparator inputs. The top comparator output has falling and rising edges that correspond to the times that the output MOSFETs should be cleared. See the wave forms in FIG. 25 (I and Q are flipped so the ModAmp performs lower sideband modulation). Similarly the lower comparator's edges correspond to times when the output MOSFETs should be set.

Figure 39:
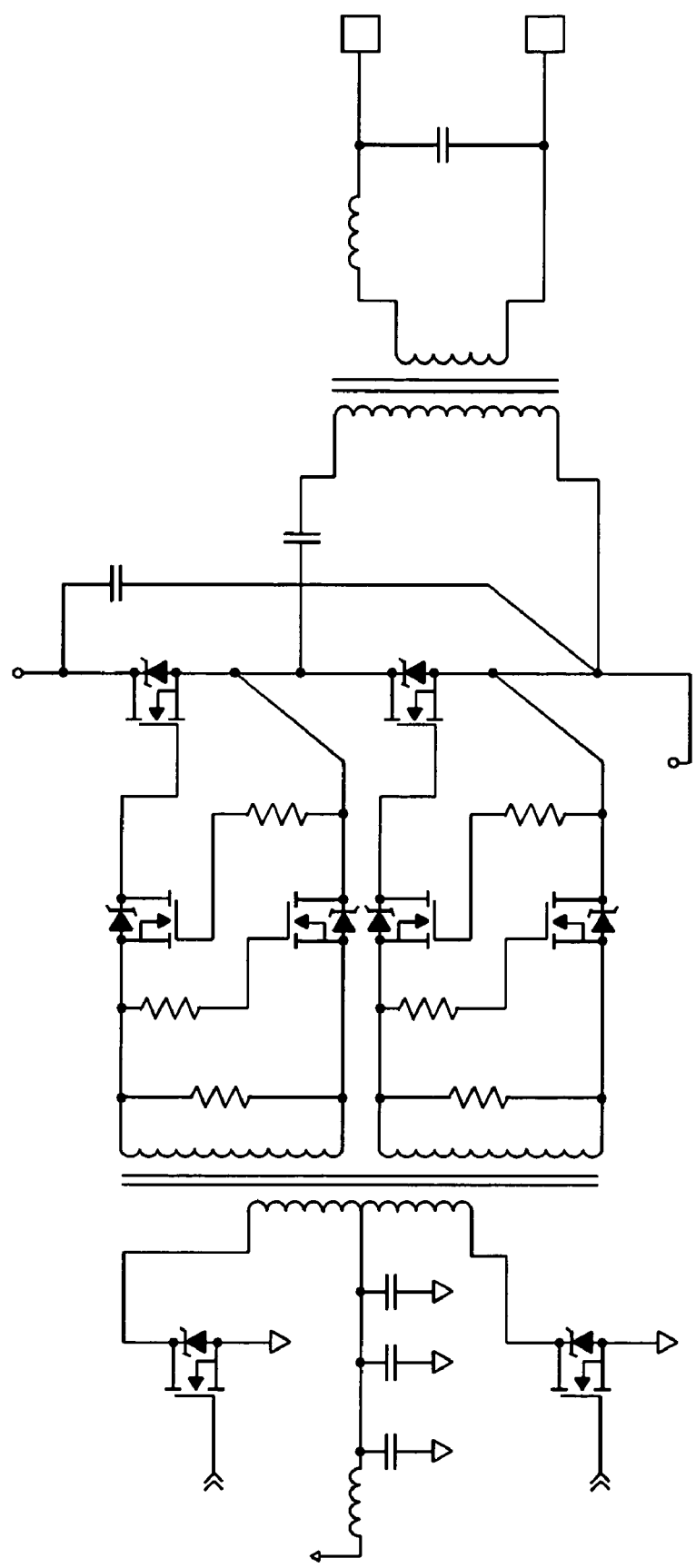
FIG. 39 is a continuation of the diagram of FIGS. 36–38.

Regarding Pulse Synthesizer Circuits, the outputs of the comparators are fed to an edge detector circuit that generates a short 350 nS pulse on both the positive going and negative going comparator transitions. These "event trigger" signals are used to set and clear the output state. Also pulse driver circuits are provided. FIG. 39 shows the A-set and A-clear event trigger pulses controlling the gates of Q1 and Q2. Next, Q1 and Q2 drives T3 in push-pull mode. The secondaries of T3 have a series of short alternating negative and positive going pulses with an amplitude of about +/−10V.

Now considering MOSFET Pulse to Level Converters and Output Stage, for each main MOSFET is driven by a pair of steering MOSFETs (Q3, Q4 and Q5, Q6) which converts the short event trigger pulses to steady-state voltage levels. By using MOSFETs with different gate thresholds and the secondary-to-secondary coupling in the pulse transformer, this novel circuit design guarantees that the main MOSFETs will avoid cross-conduction (or shoot through) and will operate over a wide duty cycle range.

Lastly a Transducer Isolation and Matching Stage is provided. Transformer T4 achieves the required transducer isolation from the mains and the matching inductor and capacitor form a tuned circuit with the transducer to help boost the voltage level and equalize the system.

It is to be understood that the above-referenced arrangements are illustrative of the application for the principles of the present invention. Numerous modifications and alternative arrangements can be devised without departing from the spirit and scope of the present invention while the present invention has been shown in the drawings and described above in connection with the exemplary embodiments(s) of the invention. It will be apparent to those of ordinary skill in the art that numerous modifications can be made without departing from the principles and concepts of the invention as set forth in the claims.

The invention claimed is:

1. A modulator/amplifier (ModAmp) comprising:
   a carrier reference generator for generating a carrier signal;
   an event generator configured for comparing an audio input signal to the carrier signal, and generating event trigger signals based on said comparing;
   an AM modulator configured for receiving the event trigger signals and generating double sideband modulation of the carrier signal;
   an SSB modulator configured for receiving the event trigger signals and generating SSB modulation of the carrier signal; and
   an output driver configured for receiving AM modulated or SSB modulated carrier signals and outputting a drive signal based thereon suitable for driving an ultrasonic transducer in a parametric sound reproduction system;
   wherein event trigger signals are related to the audio input signal by a non-linear function and modulation is switch-mode modulation based on the event trigger signals.

2. The ModAmp according to claim 1, further comprising:
   a power supply configured for powering the ModAmp; and a power supply rejection circuit.

3. The ModAmp according to claim 1, further comprising an audio preprocessor for generating a preprocessed audio input to generate in-phase and quadrature audio input signals.

4. The ModAmp according to claim 3, further comprising an audio preprocessor configured to dynamically control a level of the carrier signal based upon the preprocessed audio input.

5. The ModAmp according to claim 1, wherein the ModAmp is configured for one of bi-level, tri-level, 4-level, and 5-level steady states in switching modulation/amplification.

6. The ModAmp according to claim 1, configured to perform at least one of SSB and DSB modulation.

7. The ModAmp according to claim 1, wherein the ModAmp is configured for modulation each with reduced third harmonic.

8. The ModAmp according to claim 1, wherein switching occurs at one of 2, 3 or 4 times a frequency of the carrier signal.

9. The ModAmp according to claim 1, wherein the ModAmp is configured for bi-level SSB modulation based on a staggered drive.

10. A method for frequency shifting and amplifying an audio signal for use in a parametric loudspeaker system, including the steps of,
   i) receiving at least one input audio signal,
   ii) creating at least one reference signal,
   iii) comparing the at least one input audio signal with the at least one reference signal to derive at least one compared product signal,
   iv) delivering the at least one compared product signal to a switching power stage wherein at least one operation is performed selected from the following:
      a) performing nonlinear preprocessing with respect to the input audio signal, and,
      b) creating a non-triangle wave as the at least one reference signal; and
   v) frequency shifting and amplifying the input audio signal by modulating the reference signal in the switching power stage.

11. A method as set forth in claim 10, wherein there is a non-linear relationship between the input audio signal and timing of state changes in the switching power stage.

12. A method as set forth in claim 10, wherein the non-linear preprocessing of the audio input signal is based on an arcsine function.

13. A method as set forth in claim 10, wherein the non-triangle wave is a sinusoidal wave.

14. A method as set forth in claim 10, wherein the at least one reference signal is modulated in one of a lower sideband, upper sideband, or both upper and lower sidebands.

15. A method as set forth in claim 10, wherein switching in the switching power stage occurs at one of 2,3,4,5, and 6 times the reference frequency.

16. A method as set forth in claim 10, wherein the step of creating at least one reference signal comprises providing a power supply rejection circuit and controlling a frequency of the reference signal to within a selected range.

17. A method as set forth in claim 10, further comprising at least one of the steps of:
   performing frequency modulation;
   performing quadrature phase shift keying; and
   performing quadrature amplitude modulation.

18. A modulator-amplifier operable for use in a parametric sound reproduction system for reproducing audio information in a medium, comprising:
   an input configured for receiving at least one input signal including audio information;
   at least one reference signal generator configured for generating at least one carrier signal;
   a switch mode modulator configured to modulate the at least one carrier signal, configured so that there is a non-linear relationship between the at least one input signal and state transitions of a switching output waveform; and
   wherein the modulator-amplifier is configured to generate an output signal that has been shifted in frequency relative to a frequency of the at least one input signal and wherein the output signal includes at least one sideband.

19. A modulator-amplifier as set forth in claim 18, wherein the output signal comprises two sidebands and satisfies at least one condition of a) the audio information being divided between the two sidebands unevenly and b) a strength of the output signal is divided between the two sidebands unevenly.

20. A system for generating an acoustic output reproducing an audio signal in an acoustic parametric array in an acoustic wave-transmitting medium, comprising:
   a) a modulator-amplifier which produces a modulated carrier wave output which comprises a carrier waveform at an ultrasonic frequency modulated so as to include a processed audio signal, the modulated carrier wave output is operable for driving a transducer to reproduce the audio signal from the acoustic parametric array;
      the modulator-amplifier including an event generator for generating a timing signal based on comparison of the audio signal and a carrier signal;
      the modulator-amplifier further comprising a switching output stage coupled to the event generator for signaling the switching output stage, wherein timing of switching state transitions in the switching output stage is related to the audio signal by a non-linear function; and
   b) an ultrasonic transducer coupled to the modulator-amplifier which converts the modulated carrier wave output into an ultrasonic waveform for producing an audio wave in a medium, whereby a pre-processed audio source signal is amplified and reproduced from the parametric array in the medium.

* * * * *